US012811592B2

(12) United States Patent
Gaide et al.

(10) Patent No.: US 12,811,592 B2
(45) Date of Patent: Nov. 24, 2026

(54) PROGRAMMABLE LOGIC FABRIC AS DIE TO DIE INTERCONNECT

(71) Applicant: XILINX, INC., San Jose, CA (US)

(72) Inventors: Brian C. Gaide, Erie, CO (US); Sagheer Ahmad, Cupertino, CA (US); Trevor J. Bauer, Boulder, CO (US); Kenneth Ma, Cupertino, CA (US); David P. Schultz, Seattle, WA (US); John O'Dwyer, Kildare (IE); Richard W. Swanson, Springdale, UT (US); Bhuvanachandran K. Nair, Fremont, CA (US); Millind Mittal, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 157 days.

(21) Appl. No.: 18/123,160

(22) Filed: Mar. 17, 2023

(65) Prior Publication Data

US 2024/0313781 A1 Sep. 19, 2024

(51) Int. Cl.

*H03K 19/17736* (2020.01)
*G01R 31/317* (2006.01)
*H03K 19/0175* (2006.01)
*H03K 19/17796* (2020.01)

(52) U.S. Cl.

CPC . *H03K 19/17744* (2013.01); *G01R 31/31701* (2013.01); *H03K 19/017581* (2013.01); *H03K 19/17796* (2013.01)

(58) Field of Classification Search

CPC ..... H03K 19/17744; H03K 19/017581; H03K 19/17796; G01R 31/31701
See application file for complete search history.

(56) References Cited

U.S. PATENT DOCUMENTS

| | | | | |
|---|---|---|---|---|
| 9,859,896 B1 * | 1/2018 | Gaide | .............. | H03K 19/17744 |
| 10,410,694 B1 * | 9/2019 | Arbel | .................... | G11C 7/1069 |
| 10,673,439 B1 * | 6/2020 | Ahmad | ............ | H03K 19/17728 |
| 10,963,411 B1 * | 3/2021 | Voogel | ................ | G06F 13/1668 |
| 2009/0160483 A1 * | 6/2009 | Verma | .................. | H03K 19/177 326/39 |
| 2019/0044519 A1 * | 2/2019 | Atsatt | .............. | H03K 19/17772 |

(Continued)

FOREIGN PATENT DOCUMENTS

WO WO-2017164872 A1 * 9/2017 ..... G01R 31/318563

OTHER PUBLICATIONS

U.S. Appl. No. 18/086,531, filed Dec. 21, 2022 Entitled "NOC Routing in a Multi-Chip Device".

(Continued)

*Primary Examiner* — Seokjin Kim

(74) *Attorney, Agent, or Firm* — Patterson + Sheridan, LLP

(57) ABSTRACT

Embodiments herein describe connecting an ASIC to another integrated circuit (or die) using inter-die connections. In one embodiment, an ASIC includes a fabric sliver (e.g., a small region of programmable logic circuitry). Inter-die fabric extension connections are used to connect the fabric sliver in the ASIC to fabric (e.g., programmable logic) in the other integrated circuit. These connections effectively extend the fabric in the ASIC to include the fabric in the other integrated circuit. Hardened IP blocks in the ASIC can then use the fabric sliver and the inter-die extension connections to access computer resources in the other integrated circuit.

20 Claims, 19 Drawing Sheets

(56) References Cited

U.S. PATENT DOCUMENTS

| | | | | |
|---|---|---|---|---|
| 2019/0140648 | A1* | 5/2019 | Clark | H03K 19/1776 |
| 2021/0073053 | A1* | 3/2021 | Kumar | G06F 13/4063 |
| 2021/0111116 | A1* | 4/2021 | Teh | H03K 19/17704 |
| 2021/0313988 | A1* | 10/2021 | Weber | H03K 19/1774 |
| 2021/0376833 | A1* | 12/2021 | Jennings | H03K 19/1774 |
| 2022/0013488 | A1* | 1/2022 | Kumashikar | H10W 72/072 |
| 2022/0109446 | A1* | 4/2022 | Rotker | H03K 19/017581 |
| 2022/0337251 | A1* | 10/2022 | Nalamalpu | H03K 19/17796 |
| 2023/0023258 | A1* | 1/2023 | Laursen | H04J 14/0209 |
| 2023/0066736 | A1* | 3/2023 | Srinivasan | G06F 13/4018 |
| 2023/0141709 | A1* | 5/2023 | Srinivasan | G06F 13/4282 710/314 |
| 2023/0244628 | A1* | 8/2023 | Srinivasan | G06F 13/4265 710/305 |
| 2023/0253965 | A1* | 8/2023 | Gutala | G11C 7/10 |
| 2024/0128974 | A1* | 4/2024 | Dubey | H04L 25/0272 |
| 2024/0184736 | A1* | 6/2024 | Schultz | G06F 13/4291 |
| 2024/0186999 | A1* | 6/2024 | Schultz | G06F 13/4291 |
| 2024/0211422 | A1* | 6/2024 | Gupta | G06F 13/4022 |
| 2024/0223789 | A1* | 7/2024 | Reddy | G06F 13/1663 |
| 2024/0311084 | A1* | 9/2024 | Roberts | G06F 7/582 |
| 2024/0403532 | A1* | 12/2024 | Kolor | G06F 13/4068 |

OTHER PUBLICATIONS

U.S. Appl. No. 17/964,762, filed Oct. 12, 2022 Entitled "Low Power Driver Scheme for On-Chip and Interposer Based Data Transmission".

U.S. Appl. No. 18/073,327, filed Dec. 1, 2022 Entitled "Clocking Architecture for Communicating Clock Signals Having Different Frequencies Over a Communication Interface".

U.S. Appl. No. 18/073,288, filed Dec. 1, 2022 Entitled "Clocking Architecture for Communicating Synchronous and Asynchronous Clock Signals Over a Communication Interface".

U.S. Appl. No. 17/551,132, filed Dec. 14, 2021 Entitled "Mutli-Use Chip-to-Chip Interface".

U.S. Appl. No. 17/589,633, filed Jan. 31, 2022 Entitled "Adaptive Chip-to-Chip Interface Protocol Architecture".

* cited by examiner

PROGRAMMABLE LOGIC FABRIC AS DIE TO DIE INTERCONNECT

TECHNICAL FIELD

Examples of the present disclosure generally relate to using inter-die fabric extension connections to connect an application specific integrated circuit (ASIC) die to other dies.

BACKGROUND

Silicon stacked interconnect technology (SSIT) involves packaging multiple field programmable gate array (FPGA) dies into a single package that includes an interposer die and a package substrate. Utilizing SSIT expands FPGA products into higher density, lower power, greater functionality, and application specific platform solutions with low cost and fast-to-market advantages.

Currently, SSIT connects fabric in one FGPA die to fabric in another FPGA die. However, some applications require hardened intellectual property (IP) blocks in an application specific integrated circuit (ASIC) die to meet specific performance targets. Such hardened IP blocks could occupy most of or even the entire reticle-sized die and may also scaled into multiple dies of their own.

For adaptive Computing applications that use both ASIC dies and FPGA Fabric resources, the programmable logic in the fabric and other IP blocks, such as SerDes, Ethernet MAC, USB, PCIe IP cores will reside on another die(s) that need to be connected to the ASIC die(s) via die-to-die interconnects. Current solutions do not provide efficient techniques for coupling ASIC dies to these off-die resources.

SUMMARY

One example is a system that includes an application specific integrated circuit (ASIC) that includes a fabric sliver comprising programmable logic circuitry and a plurality of hardened IP blocks comprising circuitry configured to communicate with the fabric sliver. The system also includes a second integrated circuit separate from the ASIC, the integrated circuit comprising a programmable logic fabric and inter-die fabric extension connections coupled at a first end to the fabric sliver and at a second end to the programmable logic fabric.

Another embodiment described herein is a system that includes an ASIC that includes a hardened chip-to-chip (C2C) interface and a plurality of hardened IP blocks comprising circuitry configured to communicate with the hardened C2C interface. The system also includes a field programmable gate array (FPGA) separate from the ASIC. the FPGA including a programmable logic fabric. The system also includes inter-die connections coupled at a first end to the hardened C2C interface and at a second end to the programmable logic fabric.

Another embodiment described herein is a system that includes an ASIC that includes a fabric sliver comprising programmable logic circuitry and a plurality of hardened IP blocks comprising circuitry configured to communicate with the fabric sliver. The system also includes a second integrated circuit separate from the ASIC, the integrated circuit including a programmable logic fabric. The system also includes inter-die fabric extension connections coupled to both the fabric sliver and the programmable logic fabric, wherein the inter-die fabric extension connections extend the programmable logic fabric so that the programmable logic circuitry in the ASIC is part of the programmable logic fabric in the second integrated circuit.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
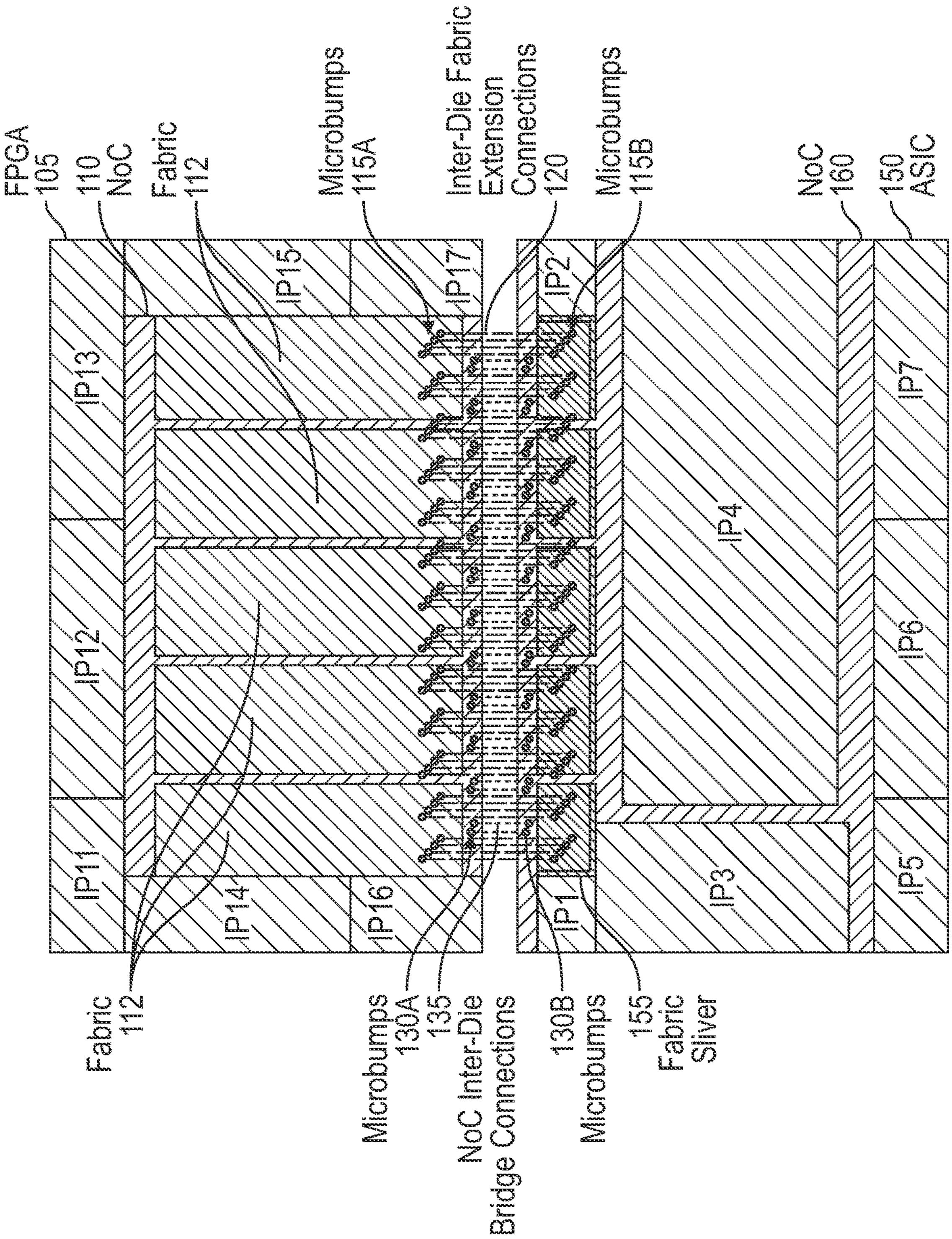
FIG. 1 illustrates communicating between an ASIC and an FPGA using inter-die fabric extension connections, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe connecting an ASIC to another die using inter-die connections. In one embodiment, an ASIC includes a fabric sliver (e.g., a small region of programmable logic circuitry). The fabric sliver can have circuitry typically found in an programmable logic in an FPGA such as configuration logic blocks (CLBs), configurable logic elements (CLEs), look up tables (LUTs), and the like. In addition, inter-die fabric extension connections are used to connect the fabric sliver in the ASIC to fabric (e.g., programmable logic) in the other die. These connections effectively extend the fabric in the ASIC to include the fabric in the other die.

In one embodiment, the ASIC is coupled, via the fabric sliver and the fabric extension connections, to an FPGA. The fabric sliver can then be configured to permit the hardened IP blocks in the ASIC to use the fabric resources in the FPGA. In another embodiment, the ASIC is coupled, via the fabric sliver and the fabric extension connections, to a fabric sliver in another ASIC. Both of the fabric slivers can be configured to permit the IP cores in both of the ASICs to communicate.

In another embodiment, rather than adding a fabric sliver to the ASIC, the ASIC can include a hardened interface (e.g., a non-programmable interface) that is coupled by inter-die connections to fabric in an FPGA. While this means the interface is no longer programmable (unlike the fabric sliver), but the interface may use less space in the ASIC and still permit the IP cores in the ASIC to use the fabric resources in the FPGA.

FIG. 1 illustrates communicating between an ASIC 150 and an FPGA 105 using inter-die fabric extension connections, according to an example. As shown, the ASIC 150 and the FPGA 105 are separate dies (e.g., separate integrated circuits). While shown as being disposed side-by-side (e.g., on a common substrate), the ASIC 150 and FPGA 105 could also be disposed in a stack.

The ASIC 150 includes various IP blocks that are interconnected by a network-on-chip (NoC) 160. The IP cores can be input/output (I/O) circuitry, processors, controllers, accelerators, data processing engines, and this like. In this example, the IP blocks are hardened circuits that have a fixed function. Thus, the functions of the IP blocks are known. In contrast, the ASIC 150 also includes a fabric sliver 155 (e.g., a programmable chip-to-chip (C2C) interface) which can be reconfigured (or reprogrammed) to perform different functions. In one embodiment, the fabric sliver 155 includes programmable logic. The programmable logic can include CLBs, CLEs, LUTS, and the like which can be configured to performed various different functions. Thus, the function of the fabric sliver 155 can be changed depending on the desires of the user or customer.

In addition to connecting the IP blocks to each other, the NoC 160 can connect the fabric sliver 155 to the IP blocks. That is, IP blocks that are not directly neighboring the fabric sliver 155 can use the NoC 160 to transmit and receive data from the fabric sliver 155. In contrast, the IP blocks such as IP1, IP2, and IP3 can directly communicate with the fabric sliver 155 rather than having to use the NoC 160.

The system in FIG. 1 includes inter-die fabric extension connections 120 that connect the fabric sliver 155 in the ASIC 150 to the fabric in the FPGA 105. As shown, the FPGA 105 includes IP blocks that are connected by a NoC 110 and fabric 112. In this example, portions of the NoC 110 extend through the fabric 112, although this is not a requirement.

Both the FPGA 105 and the ASIC 150 include microbumps 115 disposed under the fabric 112 and the fabric sliver 155. The mircobumps 115A on the FPGA 105 are connected to circuitry in the fabric 112 (e.g., the CLBs, CLEs, LUTs, etc.) while the microbumps 115B on the ASIC 150 are connected to circuitry in the fabric sliver 155 (e.g., the CLBs, CLEs, LUTs, etc.). In one embodiment, the microbumps 115 are located within each CLE where the number of CLEs scale both horizontally and vertically within the fabric regions. There can be multiple microbumps 115 per CLE (e.g., six). In one embodiment, the multiple microbumps 115 within a CLE are interchangeable from a connectivity perspective. Moreover, the microbumps 115 support redundancy for yield and reliability enhancement. The microbumps 115A on the FPGA 105 are then connected to the microbumps 115B on the ASIC 150 using the inter-die fabric extension connections 120.

In one embodiment, the inter-die fabric extension connections 120 extend the fabric 112 in the FPGA 105 to include the fabric sliver 155 in the ASIC 150. That is, to the perspective of the IP blocks in the FPGA 105, and the IP blocks in the ASIC 150, the fabric 112 and the fabric sliver 155 appear as a single fabric~e.g., a continuous programmable logic (PL) fabric. Because of the microbumps 115 and the inter-die fabric extension connections 120, the fabric sliver 155 can be considered as an extension of, or a part of, the fabric 112 in the FPGA 105. Thus, by adding the fabric sliver 155 to the ASIC 150, the high-speed inter-die fabric extension connections 120 can be used to connect the IP blocks in the ASIC 150 to the FPGA 105. That is, the IP blocks in the ASIC 150 can transmit data to the fabric sliver 155 which in turns uses the high-speed fabric extension connections 120 to communicate with the fabric 112 in the FPGA 105. The fabric 112 can then process data received from the ASIC 150 and return results, or can route the data to the IP blocks in the FPGA 105 for processing. In this manner, the fabric sliver 155 makes the resources in the FPGA 105 (whether that is compute resources in the fabric 112 itself or in the IP blocks) available to the IP blocks in the ASIC 150.

The process can also work in the reverse. For example, an IP block in the FPGA 105 or a processing element implemented in the fabric 112 may want to transmit data to an IP block in the ASIC 150. The FPGA 105 can use the connections 120 and the fabric sliver 155 to communicate to the IP blocks in the ASIC 150.

As an example, if the fabric sliver 155 contains 80 columns and 60 rows of CLEs, and each CLE has 6 microbumps 115 running at 500 MHz, this will support a maximum bandwidth of 80×60×6×500 Mbps which equals to 14,400 Gbps or 1.8 TeraByte/s, enough to carry two HBM3 memory stacks running at 6400 Mbps/lane or more than 35 channels of DDR5 at 6400 Mbps.

In addition to the inter-die fabric extension connections 120, the FPGA 105 and the ASIC 150 include microbumps 130 disposed in regions containing the NoCs 110 and 160. That is, the microbumps 130A on the FPGA 105 are connected to a portion of the NoC 110 that is adjacent to the ASIC 150 while the microbumps 130B on the ASIC are connected to a portion of the NoC 160 that is adjacent to the FPGA 105. The microbumps 120 on the FPGA 105 and the ASIC 150 are connected using NoC inter-die bridge connections 135. These high speed connections permit the NoCs 110, 160 to communicate directly without having to use an I/O circuitry on the dies (e.g., PCIe connections and the like).

The IP blocks in the ASIC 150 can use the NoC 160 and the NoC inter-die bridge connections 135 to communicate with the NoC 110 in the FPGA 105. In turn, the NoC 110 can route data to the IP blocks in the FPGA 105 or to the fabric 112 for further processing. Of course, the opposite can also occur where the IP blocks or the fabric 112 in the FPGA 105 can use the NoC inter-die bridge connections 135 to communicate with the NoC 160 to reach the IP blocks in the ASIC 150. Thus, the NoC inter-die bridge connections 135 provide another route for the IP blocks in the ASIC 150 and the IP blocks and fabric 112 in the FPGA 105 to communicate with each other.

In one embodiment, the ASIC 150 and the FPGA 105 may use both the NoC inter-die bridge connections 135 and the inter-die fabric extension connections 120 (via the fabric sliver 155) to communicate. In another embodiment, the ASIC 150 and the FPGA 105 may use the inter-die bridge connections 135 but not inter-die fabric extension connections 120, or vice versa. For example, to save costs, an ASIC may have only inter-die fabric extension connections 120 but not the NoC inter-die bridge connections 135 (or vice versa).

One example of inter-die fabric extension connections 120 are SSIT connections. However, the inter-die fabric extension connections 120 are not limited to any particular connection technology so long as the technology permits a PL fabric in the FPGA to extend to the fabric sliver in the ASIC.

In addition to providing communication between the ASIC 150 and the FPGA 105, the PL in the fabric sliver 155 can implement Design for Test (DFT) and debug logic that are either standalone or complement the existing DFT test and debug logic on the ASIC die. For example, the PL can be configured as registers and counters for performing DFT and debug before the system is operational. Advantageously, this means the amount of DFT and debug logic in the IP blocks can be reduced (or omitted). Once test/debug is complete, the PL can be reconfigured to enable communication between the ASIC 150 and the FPGA 105.

Moreover, the arrangement in FIG. 1 can be protocol-agnostic and there are no specific quanta restrictions. That is, there may not be any pre-determined "quanta" associated with a typical C2C (or chiplet-to-chiplet) interface. Also, the arrangement in FIG. 1 can be optimized to bandwidth and virtual wires requirements of the applications being executed on the dies. Also, no specific protocol is required and thus can avoid protocol translation overhead and tunneling complications which can substantially reduce latency.

Figure 2:
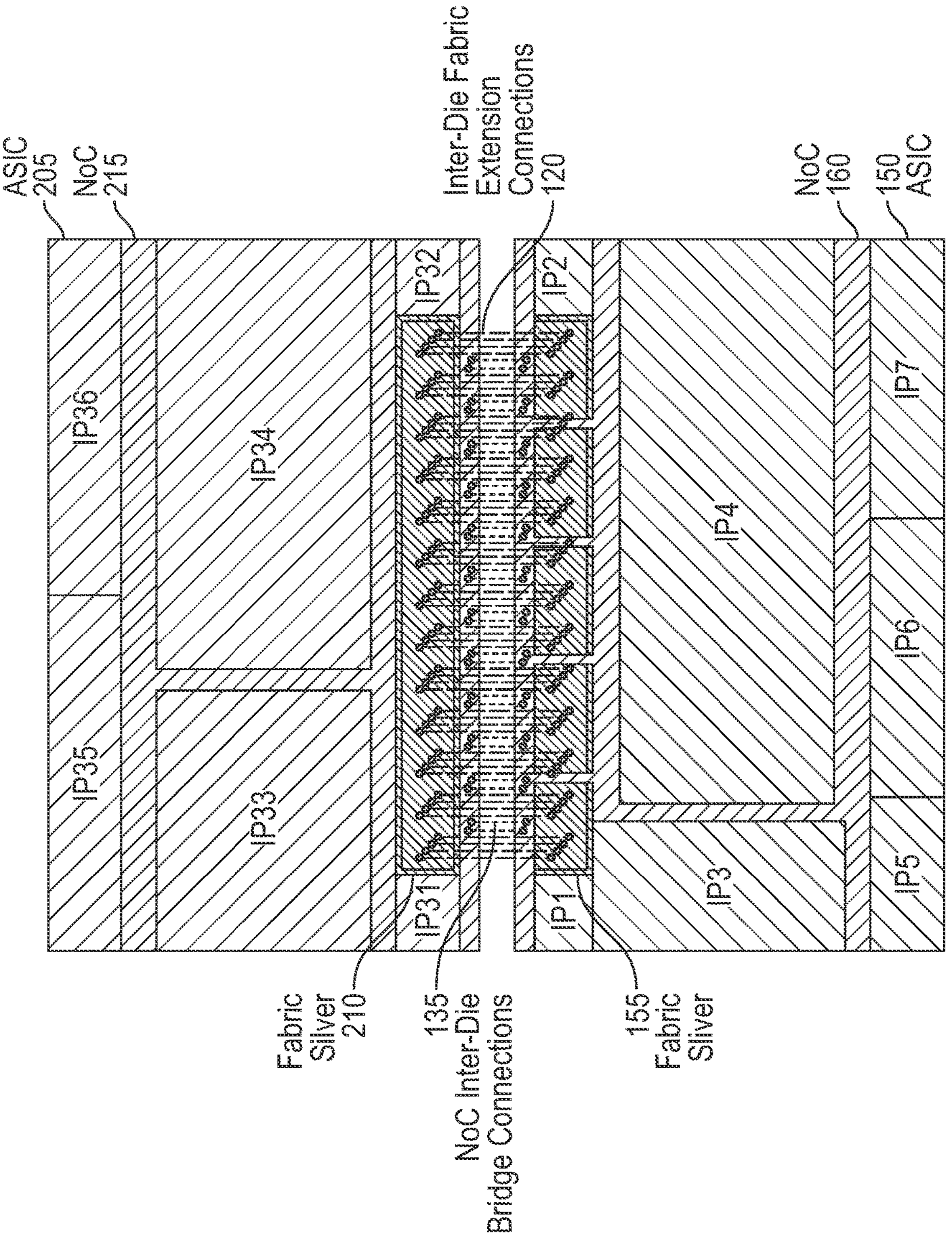
FIG. 2 illustrates communicating between two ASICs using inter-die fabric extension connections, according to an example.

FIG. 2 illustrates communicating between two ASICs using inter-die fabric extension connections, according to an example. As shown, the first ASIC 150 and the second ASIC 205 are separate dies (e.g., separate integrated circuits). While shown as being disposed side-by-side (e.g., on a common substrate), the ASICs 150 and 205 could also be disposed in a stack.

As discussed above, the ASIC 150 includes various IP blocks that are interconnected by the NoC 160. The IP cores can be I/O circuitry, processors, controllers, accelerators, data processing engines, and this like. In this example, the IP blocks are hardened circuits that have a fixed function. Thus, the functions of the IP blocks are known. In contrast, the ASIC 150 also includes the fabric sliver 155 which can be reconfigured (or reprogrammed) to perform different functions. In one embodiment, the fabric sliver 155 includes PL. The PL can include CLBs, CLEs, LUTs, and the like which can be configured to performed various different functions. Thus, the function of the fabric sliver 155 can be changed depending on the desires of the user or customer.

Like the ASIC 150, the ASIC 205 includes various IP blocks that are interconnected by a NoC 215. The IP cores in the ASIC 205 can be I/O circuitry. processors, controllers, accelerators, data processing engines, and this like. In this example, the IP blocks are hardened circuits that have a fixed function. Thus, the functions of the IP blocks are known. In contrast, the ASIC 205 also includes a fabric sliver 210 which can be reconfigured (or reprogrammed) to perform different functions. In one embodiment, the fabric sliver 210 includes PL. The PL can include CLBs, CLEs. LUTs, and the like which can be configured to performed various different functions. Thus, the function of the fabric sliver 210 can be changed depending on the desires of the user or customer.

In addition to connecting the IP blocks to each other, the NoC 215 in the ASIC 205 can connect the fabric sliver 210 to the IP blocks in the ASIC 205. That is, IP blocks that are not directly neighboring the fabric sliver 210 can use the NoC 215 to transmit and receive data from the fabric sliver 210. In contrast, the IP blocks such as IP31 and IP32 can directly communicate with the fabric sliver 210 rather than having to use the NoC 215.

The system in FIG. 2 includes the inter-die fabric extension connections 120 that connect the fabric sliver 155 in the ASIC 150 to the fabric sliver 210 in the ASIC 205. Although not labeled, both of the ASICs 150 and 210 can include microbumps disposed under the fabric slivers 155 and 210. The microbumps on the ASIC 205 are then connected to the microbumps on the ASIC 150 using the inter-die fabric extension connections 120.

In one embodiment, the inter-die fabric extension connections 120 extend the fabric sliver in the ASIC 205 to include the fabric sliver 155 in the ASIC 150. That is, to the perspective of the IP blocks in the ASIC 205, and the IP blocks in the ASIC 150, the fabric sliver 210 and the fabric sliver 155 appear as a single fabric—e.g., a continuous PL fabric. Because of the microbumps and the inter-die fabric extension connections 120, the fabric sliver 155 can be considered as an extension of, or a part of, the fabric sliver 210 in the ASIC 205. Thus, by adding the fabric slivers to both of the ASICs 150 and 205, the high-speed inter-die fabric extension connections 120 can be used to connect the IP blocks in the ASIC 150 to the ASIC 205. That is, the IP blocks in the ASIC 150 can transmit data to the fabric sliver 155 which in turns uses the high-speed fabric extension connections 120 to communicate with the fabric sliver 210 in the ASIC 205. The fabric sliver 210 can then process data received from the ASIC 150 and return results, or can route the data to the IP blocks in the ASIC 205 for processing. In this manner, the fabric slivers 155 and 210 makes the resources in the ASIC 205 (whether that is compute resources in the fabric sliver 210 itself or in the IP blocks) available to the IP blocks in the ASIC 150.

The process can also work in the reverse. For example, an IP block in the ASIC 205 may want to transmit data to an IP block in the ASIC 150. The ASIC 205 can use the connections 120 and the fabric slivers 155 and 205 to communicate to the IP blocks in the ASIC 150.

In addition to the inter-die fabric extension connections 120, the ASIC 205 and the ASIC 150 include microbumps (not labeled) disposed in regions containing the NoCs 215 and 160. That is, the microbumps on the ASIC 205 are connected to a portion of the NoC 215 that is adjacent to the ASIC 150 while the microbumps on the ASIC 150 are connected to a portion of the NoC 160 that is adjacent to the ASIC 205. The microbumps on the ASICs 150 and 205 are connected using the NoC inter-die bridge connections 135. These high speed connections permit the NoCs 215, 160 to communicate directly without having to use an I/O circuitry on the dies (e.g., PCIe connections and the like).

The IP blocks in the ASIC 150 can use the NoC 160 and the NoC inter-die bridge connections 135 to communicate with the NoC 215 in the ASIC 205. In turn, the NoC 215 can route the data to the IP blocks in the ASIC 205 for further processing. Of course, the opposite can also occur where the IP blocks in the ASIC 205 can use the NoC inter-die bridge connections 135 to communicate with the NoC 160 to reach the IP blocks in the ASIC 150. Thus, the NoC inter-die bridge connections 135 provide another route for the IP blocks in the ASIC 150 and the IP blocks in the ASIC 205 to communicate with each other.

In one embodiment, the ASIC 150 and the ASIC 205 may use both the NoC inter-die bridge connections 135 and the inter-die fabric extension connections 120 (via the fabric slivers 155 and 210) to communicate. In another embodiment, the ASIC 150 and the ASIC 205 may use the inter-die bridge connections 135 but not inter-die fabric extension connections 120, or vice versa. For example, to save costs, an ASIC may have only inter-die fabric extension connections 120 but not the NoC inter-die bridge connections 135 (or vice versa).

In addition to provide communication between the ASICs 150 and 205, the PL in the fabric slivers 155 and 210 can implement DFT and debug logic that are either standalone or complement the existing DFT test and debug logic on the ASIC dies. Advantageously, this means the amount of DFT and debug logic in the IP blocks in the ASICs 150 and 205 can be reduced (or omitted). Once test/debug is complete, the PL in the fabric slivers 155 and 210 can be reconfigured to enable communication between the ASICs 150 and 205.

Figure 3:
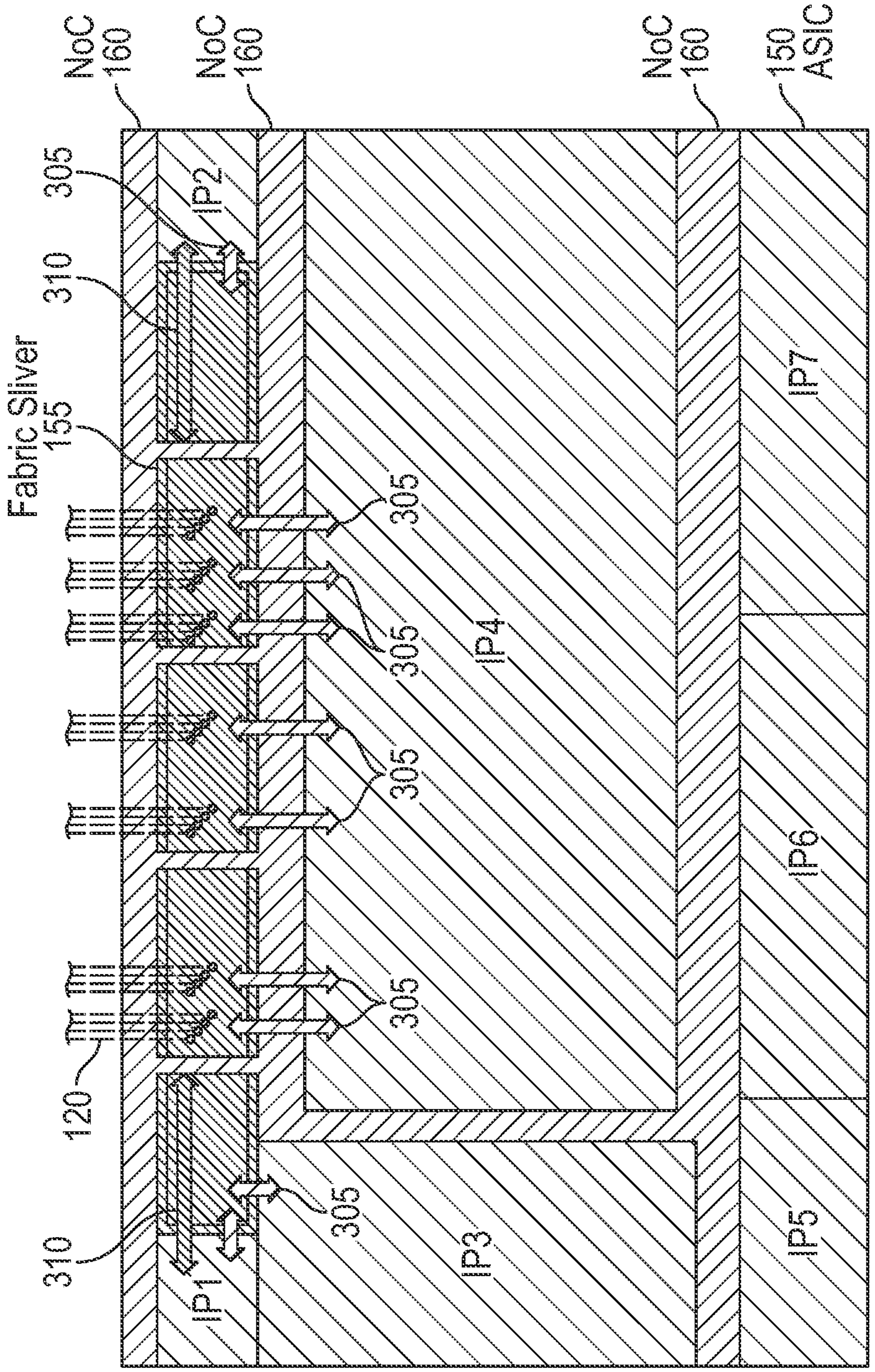
FIG. 3 illustrates a fabric sliver in an ASIC, according to an example.

FIG. 3 illustrates the fabric sliver 155 in the ASIC 150, according to an example. Specifically, FIG. 3 illustrated different ways the IP blocks can use the fabric sliver 155, in addition to the techniques discussed above. That is, FIG. 3 illustrate different use of the fabric sliver 155 than the ones discussed above where the fabric sliver 155 (along with the inter-die fabric extension connections 120) permit the IP blocks in the ASIC 150 to communicate with another die (whether that is a FPGA as in FIG. 1 or another ASIC as in FIG. 2).

The arrows 305 indicate that the fabric sliver 155 can be used as programmable glue logic between the hardened IP blocks in the ASIC 150. That is, the IP blocks in the ASIC 150 can use the fabric sliver 155 to communicate with each other. Thus, like the NoC 160, the fabric sliver 155 can serve as another on-die interconnect infrastructure that is configurable. For example, the fabric sliver 155 can be configured to provide communication paths between IP1 and IP4. However, during another period of time, the fabric sliver 155 could be reconfigured to provide communication paths between IP1 and IP2. In this manner, IP blocks that border the fabric sliver 155 can communicate using the sliver 155 rather than the NoC 160 (although they can also use the NoC 160).

The arrows 310 illustrate using the fabric sliver 155 as a bridge between the IP blocks in the ASIC 150 and the NoC 160. That is, the fabric 155 can provide additional connections between the IP blocks and the NoC 160. In this example. IP1 and IP2 use the fabric sliver 155 to communicate with portions of the NoC 160.

Figure 4:
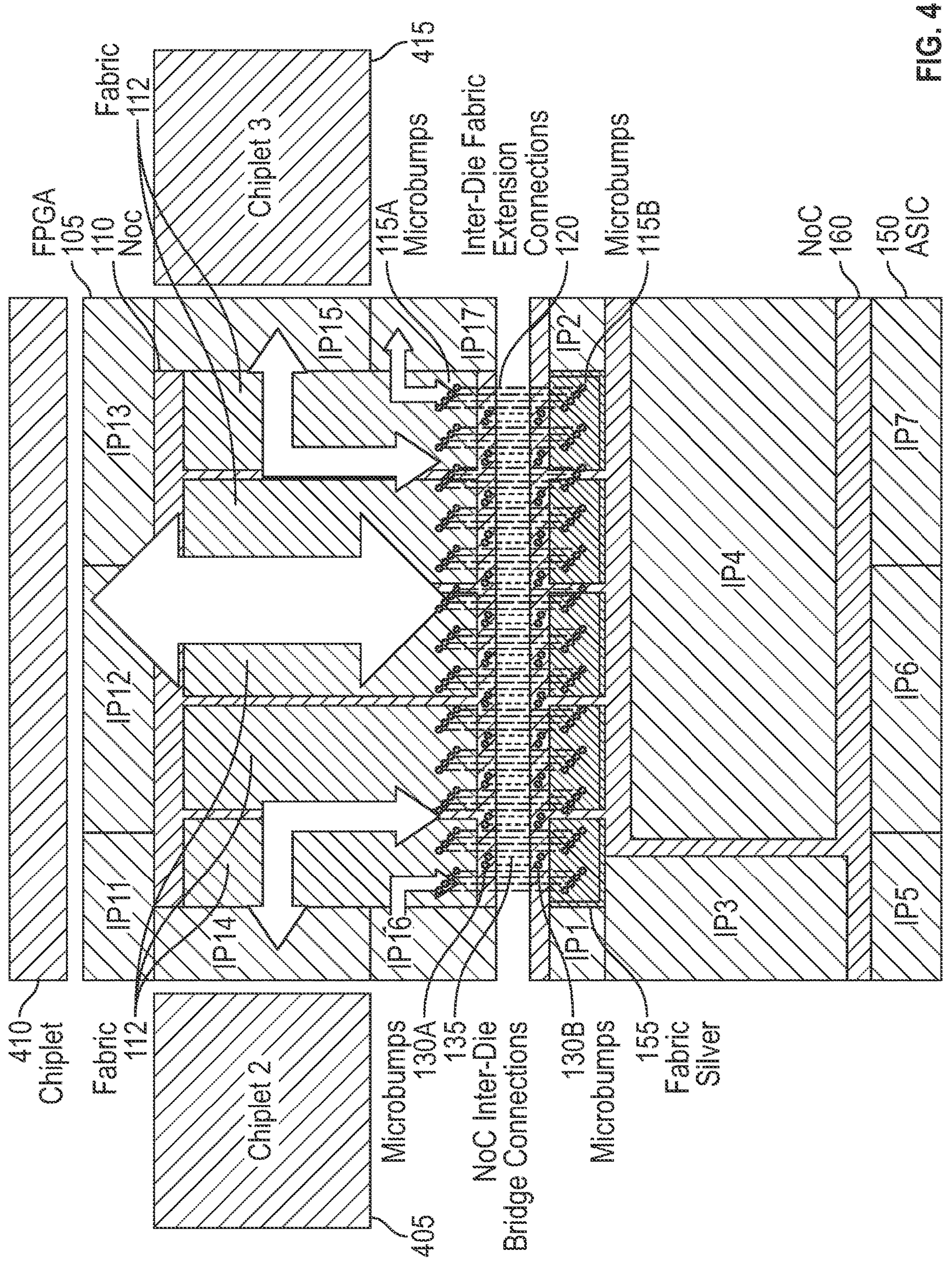
FIG. 4 illustrates communication with chiplets using inter-die fabric extension connections, according to an example.

FIG. 4 illustrates communication with chiplets using the inter-die fabric extension connections 120, according to an example. In this example, the FPGA 105 is connected to different chiplets 405, 410, and 415. The chiplets 405, 410, and 415 could be high bandwidth memory (HBM), JEDEC DDR5, accelerators, processors, and the like.

The fabric sliver 155 and the inter-die fabric extension connections 120 provide a low-latency and scalable solution to support very high bandwidth communication between the IP blocks in the ASIC 150 and the chiplets 405, 410, and 415. For example, the IP blocks in the ASIC 150 can use the fabric sliver 155 and the inter-die fabric extension connections 120 to communicate with the IP blocks in the FPGA 105 as discussed above, and then the IP blocks in the FPGA 105 can communicate with the chiplets 405, 410, and 415. In this manner, the compute resources in the chiplets 405, 410, and 415 are made available to the IP blocks in the ASIC 150.

Figure 5:
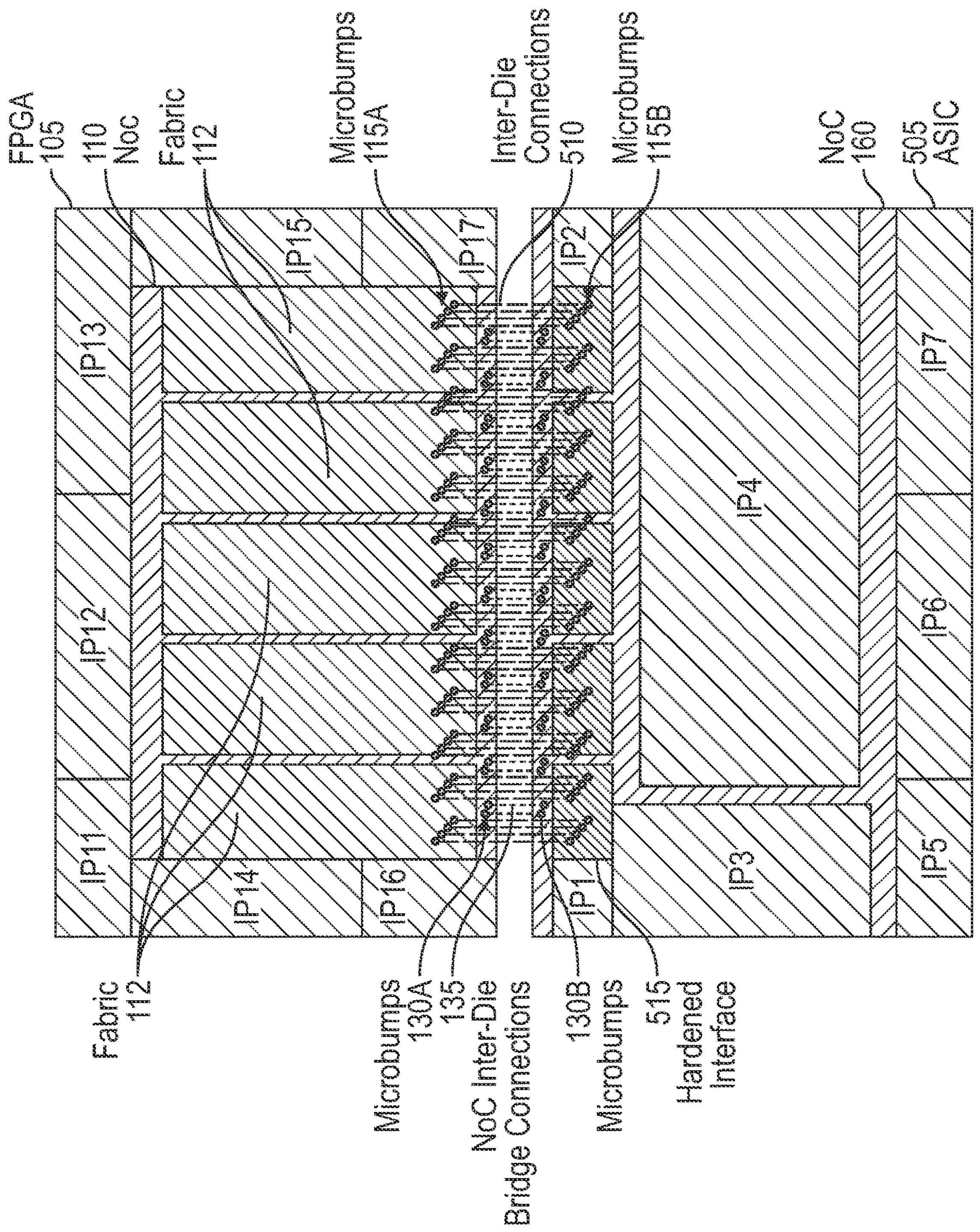
FIG. 5 illustrates communicating between an ASIC and an FPGA using inter-die connections and a hardened interface, according to an example.

FIG. 5 illustrates communicating between an ASIC 505 and an FPGA 105 using inter-die connections and a hardened C2C interface 515, according to an example. The arrangement in FIG. 5 is similar to FIG. 1, except that the ASIC 505 does not have a fabric sliver. To facilitate inter-die communication, the ASIC 505 and the FPGA 105 can still have microbumps and inter-die connections 510. However, instead of the inter-die connections 510 being connected in the ASIC 505 to PL (e.g., CLEs), the connections 510 may be coupled to drivers in the hardened C2C interface 515.

While hardening the interface in the ASIC 505 may lower cost and the size of the die, the ASIC 505 has less flexibility. For example, without the fabric sliver, the ASIC 505 does not have any local fabric which it can use to perform DFT or debug, or to insert pipeline stages. Nonetheless, the inter-die connections 510 still permit the IP blocks in the ASIC 505 to communicate with the fabric in the FPGA 105. Additionally, the ASIC 505 and the FPGA 105 can still use the NoC inter-die bridge connections 135.

Integration with PL in Two Dies or Chiplets

In addition to the embodiments above, the discussion below describes a C2C interface for tight integration of PL Fabric chiplets (or dies) such that multiple chiplets can be used as one aggregated PL Fabric device. For example, the embodiments below can be used to connect a fabric sliver in an ASIC to fabric in an FPGA as shown in FIG. 1, or to connect a fabric sliver in one ASIC to a fabric sliver in another ASIC as shown in FIG. 2.

One advantage is that a user design can be seamlessly mapped to two (or more) chiplets integrated via the C2C. Additional advantages of this C2C interface are reduced wire count compared to simple parallel wire interfaces, relatively low latency compared to existing C2C standards such as UCIe, and the flexibility needed to support PL connectivity.

The existing C2C interface for PL on many SSIT devices, called Super Long Lines (SLLs) provides a solution for system synchronous clocking between two chiplets (aka Super Logic Regions or SLRs), but this interface requires many interposer wires in order to handle the high connectivity requirements. This high signal density (i.e., signals per mm) on the interposer results in more layers of interposer, which results in higher cost. In system on chip (SoC) and central processing unit (CPU)/graphics processing unit (GPU) systems using interposer connections, high-speed C2C interfaces can be used to minimize the number C2C interconnect signals. However, such high-speed interfaces incur relatively high latency which is not acceptable for the C2C interface between PL chiplets, where they are intended to look like one large device. Another aspect of PL is the requirement to use Synthesis, Placement, Route, and Timing software tools (SPRT). For these tools to work efficiently, especially the timing component, the C2C interconnect should look like a simple wire delay where any internal timing complexity of the C2C is abstracted away. This is a completely different paradigm from SoC or CPU/GPU C2C solutions, which do not require SPRT. The goals of existing C2C solutions are generally to carry specific interface protocols, which are well-bounded in terms of address, data, and operation type. In contrast, the goals of PL C2C are to carry random signals, whose only common feature is often the clock domain. The embodiments herein provide a flexible, low-latency, system-synchronous C2C interface for connecting two PL chiplets.

As described above, PL has fundamentally different requirements for a C2C interface from those used for SoC data paths or memory transaction interfaces. The following are some of the characteristics which are desirable in a PL chip-to-chip interface:

1) One goal is to make the C2C solution look like a wire delay from the standpoint of the SPRT tools. In this way the PL timing tools do not have to handle setup time, hold time, and clock-to-out at the serializer/deserializer (SERDES) interface inputs and outputs. This simplifies end-user PL design significantly. With this implementation, the C2C interface clocks can be unrelated to the PL clocks-except for requiring a frequency that is a high enough multiple.
2) One feature of C2C interfaces using asynchronous clocking at the C2C inputs and outputs. This means that the C2C parallel and serial clocks run with an unknown phase relationship to the clocks used in the system logic that is transmitting or receiving the data or signals. Since the clocks are asynchronous, a clock domain crossing (CDC) occurs when signals pass from the transmitting system logic to the C2C interface, and from the C2C interface to the receiving system logic. If the CDC is not well-engineered, metastability and data corruption is likely. In order to provide robust CDC between the C2C and the system logic, most C2C solutions use a FIFO circuit with independent write and read clocks. The TX SERDES receives input data through a FIFO on the transmit side (a read operation) while the RX SERDES writes a FIFO on the receive side. A FIFO can have interface handshaking signals that indicate whether output data is available for read, whether there is space available for writing data, etc. While CDC FIFOs are a good solution for elimination of metastability and ensure that the data is always valid, they also add significant latency to the data transfer. Typically, the FIFOs add three cycles of latency on both RX and TX sides of the C2C. Assuming a 400 MHz clock frequency for all the clocks (for simplicity), the round trip latency would be 15 ns. That's far too long if the C2C is supposed to be treated as a simple wire delay where the delay should be comfortably less than the system clock period of 2.5 ns.
3) In current parallel SERDES C2C solutions, the data lanes within a group are treated as part of a single interface. This is generally done due to protocol handling. For example, a C2C interface might have 80 inputs, of which 64 are data and the remainder are protocol overhead. The C2C might then be composed of 10 data lanes. each with an 8:1 SERDES. These 80 signals should all meet timing to the interface clock in order to have reliable function.

The embodiments herein allow each SERDES to be treated as an independent unit (relative to the other SERDES) for timing purposes, and timing is met with respect to the system clock and not the SERDES clocks.

SERDES allows multiple signals to be transmitted on a single wire. This allows a significant reduction in the number of interposer wires used to transmit the signals between the chiplets. A SERDES is implemented with a serial clock that runs at some frequency (Fs) and a parallel clock that runs at a lower frequency (Fp) which is a divide of the serial clock frequency (Fp=Fs/N). This relationship is defined by the SERDES gearbox ratio N:1. Data is captured into N flip-flops (or latches) on the parallel clock edge, and then transferred to a shift-register composed of N flip-flops (or latches) clocked by the serial clock. The shift-register MSB is used as the output which drives an interposer wire.

Figure 6:
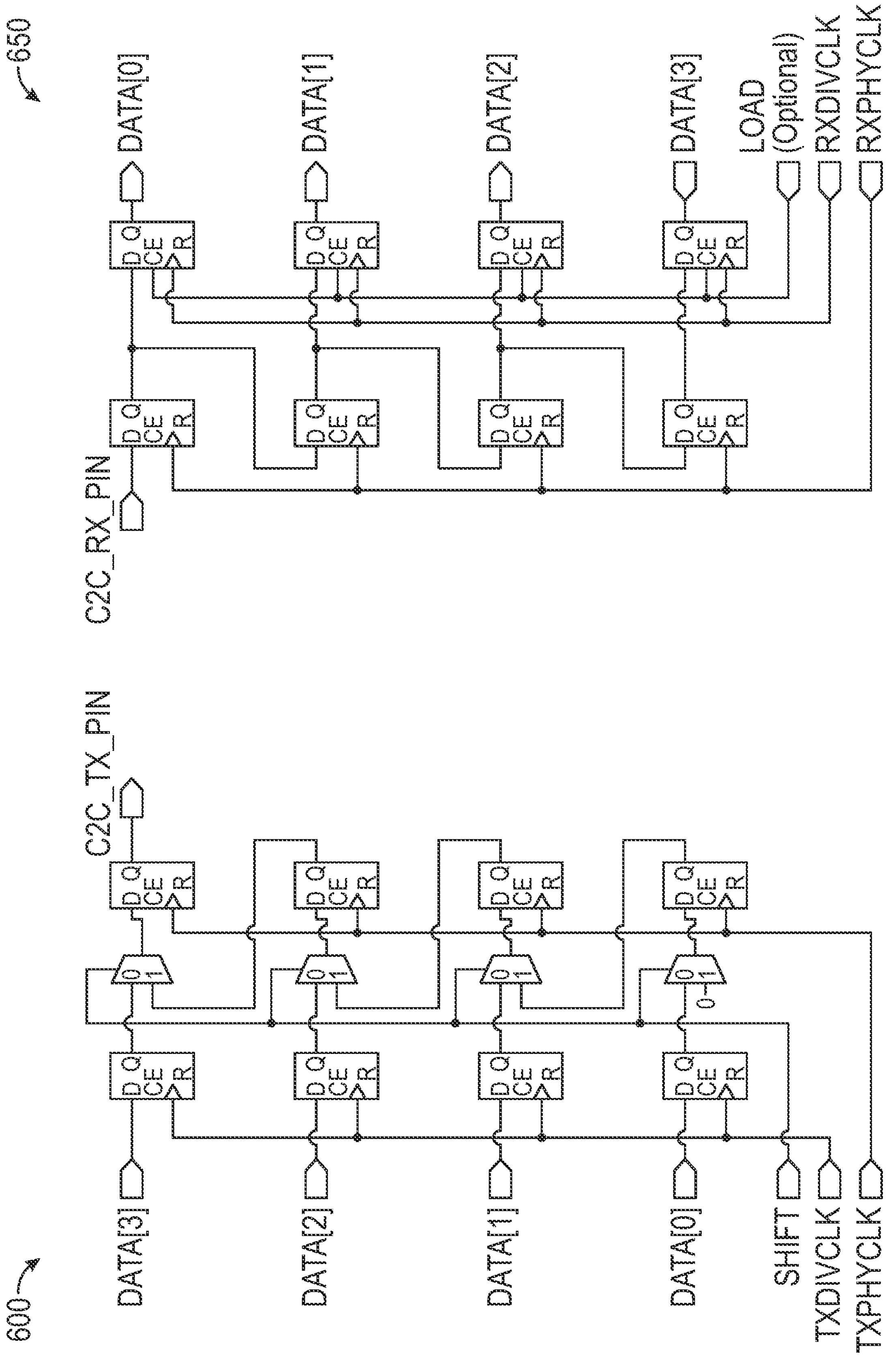
FIG. 6 illustrates a TX SERDES and a RX SERDES, according to one embodiment.

FIG. 6 illustrates a TX SERDES 600 and a RX SERDES 650, according to one embodiment. Note that the SERDES can be implemented using single data rate (SDR) or double data rate (DDR) transmission. DDR reduces latency at higher gearbox ratios. for example 8:1 or 16:1. The gearbox ratio also defines the effective wire or signal count: Effective Wires=Interposer Wires×Gearbox Ratio. It is often desirable to run the serial clock at the highest rate that can be reliably supported by the silicon and interposer technology in order to get the highest effective wire count.

The SERDES circuits can be placed in parallel for efficiency of physical implementation and to allow a modular approach to creating C2C interfaces. Looking at the spectrum of implementation options, a C2C interface could be implemented with a single group of SERDES or with many groups, depending on the signal count involved. To illustrate, if the desired number of effective wires between the Chiplets is 1000, we could implement a single 1000:1 SERDES with a parallel clock running at 5 MHz and a serial clock running at 5 GHz (5 MHz×1000), but this could not be implemented efficiently in terms of physical layout, and the parallel clock frequency would be much lower than the maximum target PL clock frequency. An alternative is to create groups of SERDES in the range of 10 to 50, with gearbox ratio between 4:1 and 16:1.

Another factor influencing the SERDES gearbox ratio is the available pin density at each end of the interface—e.g., pins per mm or some other metric. In other words, the number of signals that can be effectively connected at the inputs and outputs of the SERDES given the technology being used. For the Programmable Logic solution, the goal may be to provide the maximum possible connectivity. Again, this contrasts with SoC or CPU/GPU solutions, which are usually well-bounded with throughput requirements.

Figure 7A:
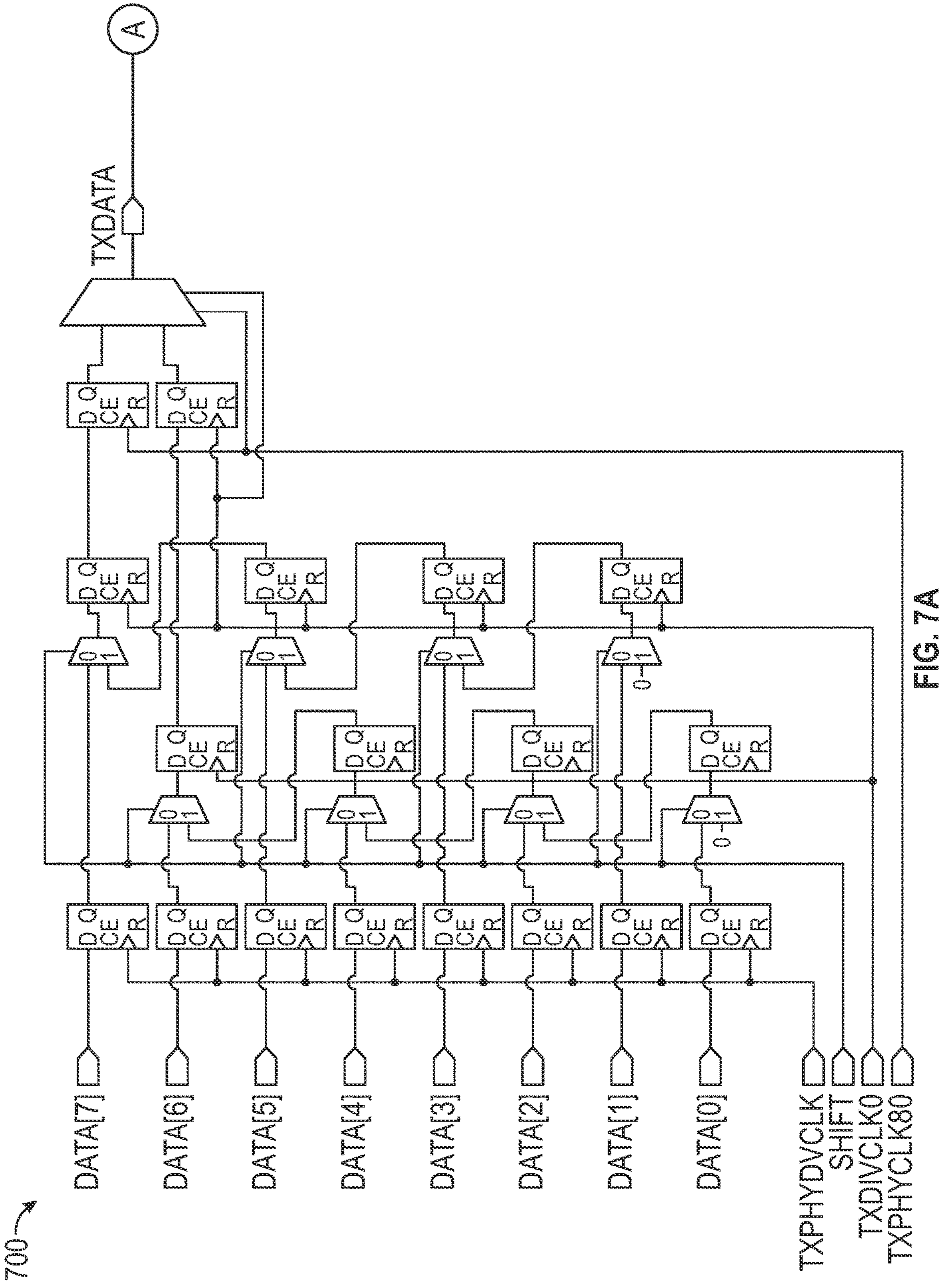
FIGS. 7A and 7B illustrate SERDES implemented with double-data rate data transmission, according to one embodiment.
Figure 7B:
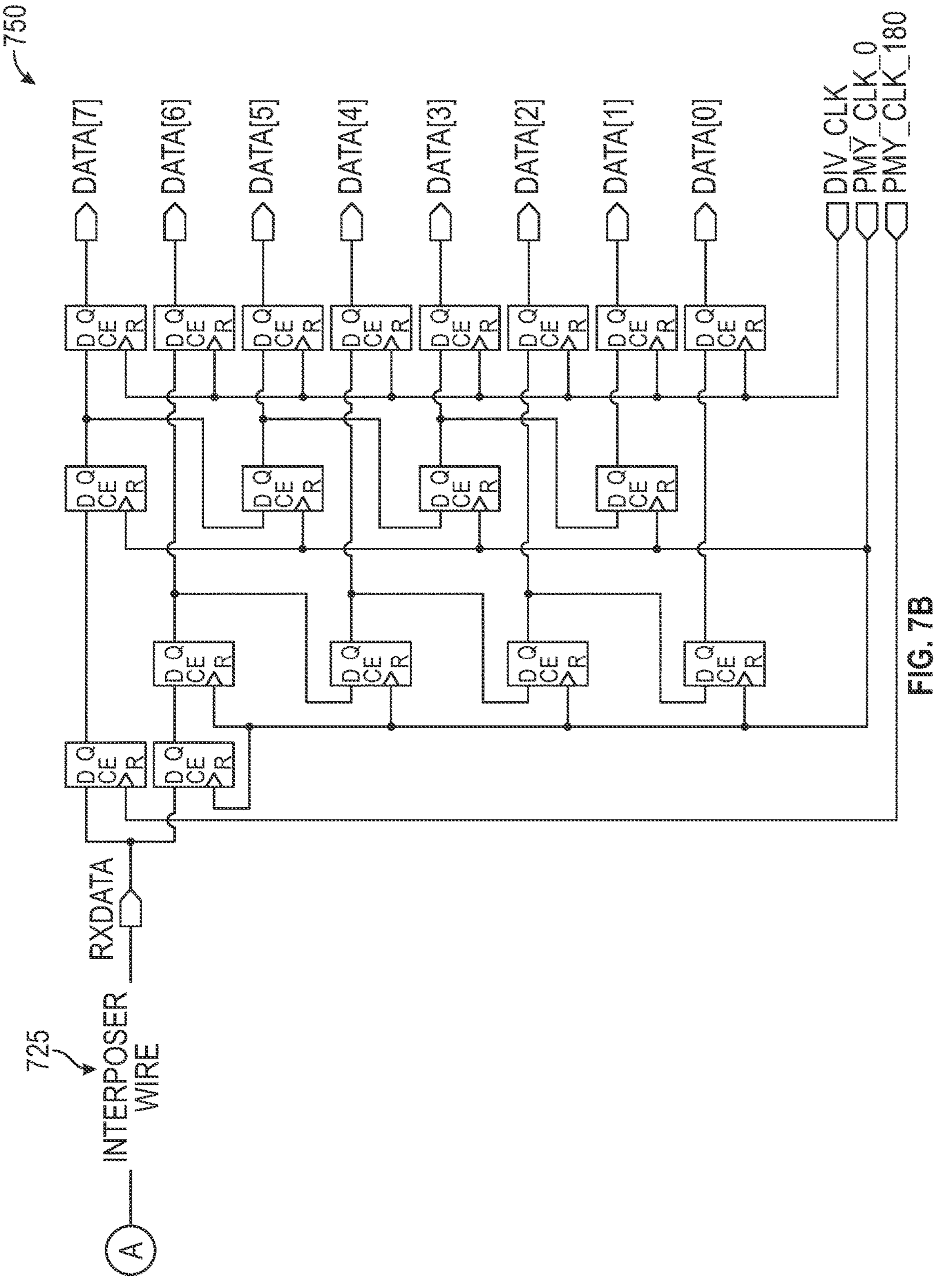

FIGS. 7A-7B illustrate SERDES implemented with double-data rate (DDR) data transmission, according to one embodiment. In FIGS. 7A-78, a TX SERDES 700 is coupled to a RX SERDES 750 using an interconnect 725.

Figure 8A:
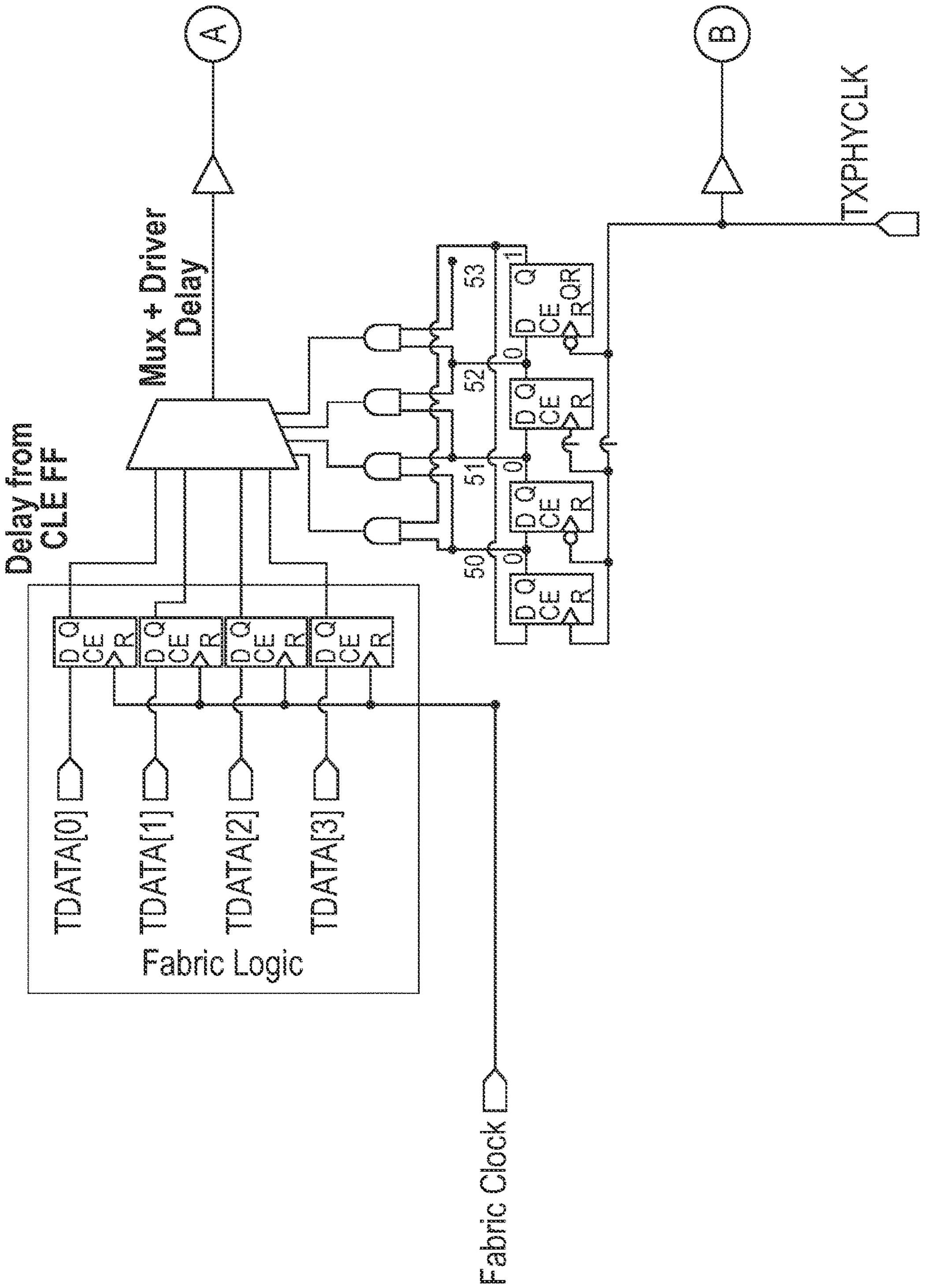
FIGS. 8A-8B illustrate oversampling SERDES, according to one embodiment.
Figure 8B:
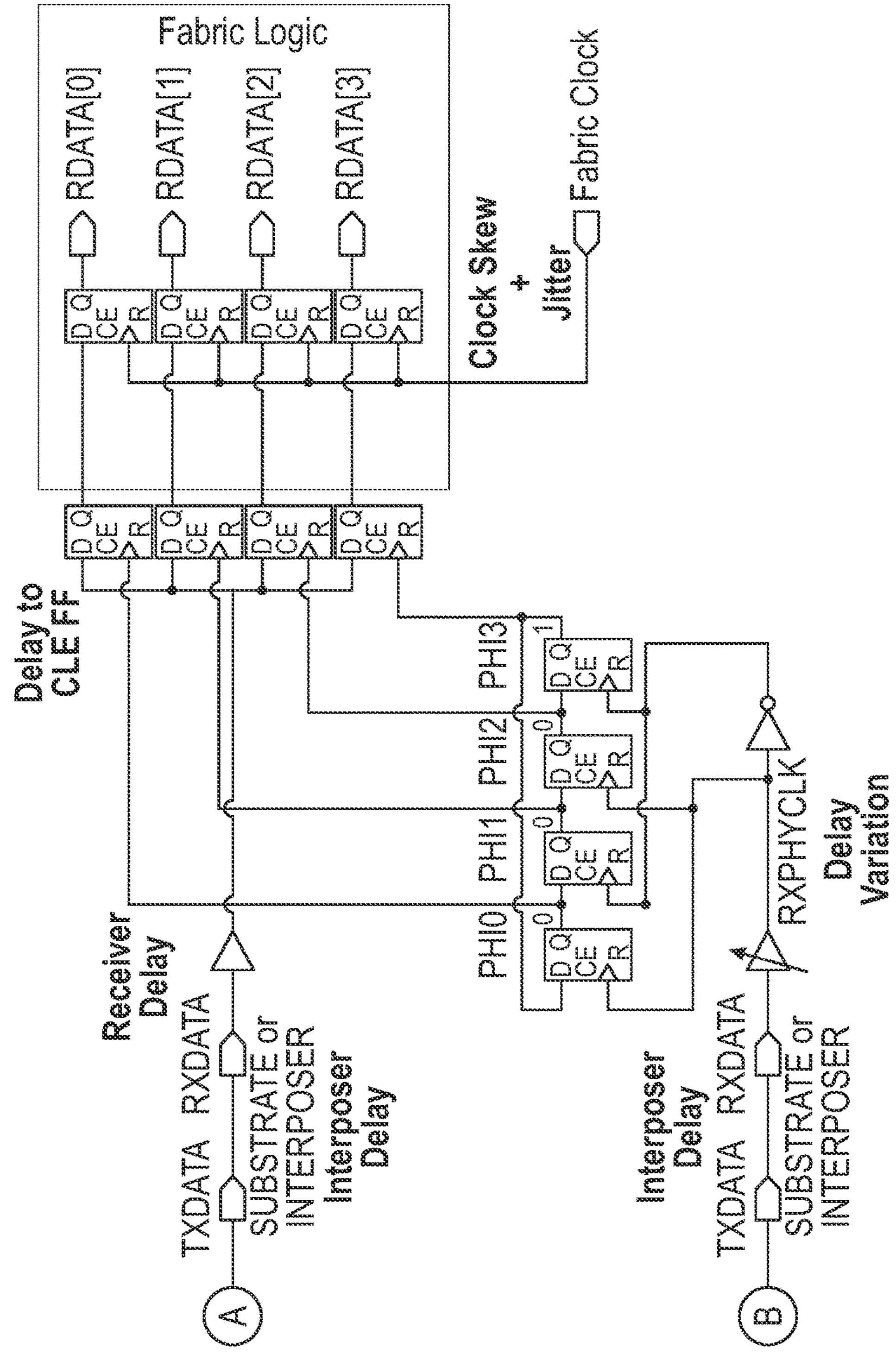
Figure 9A:
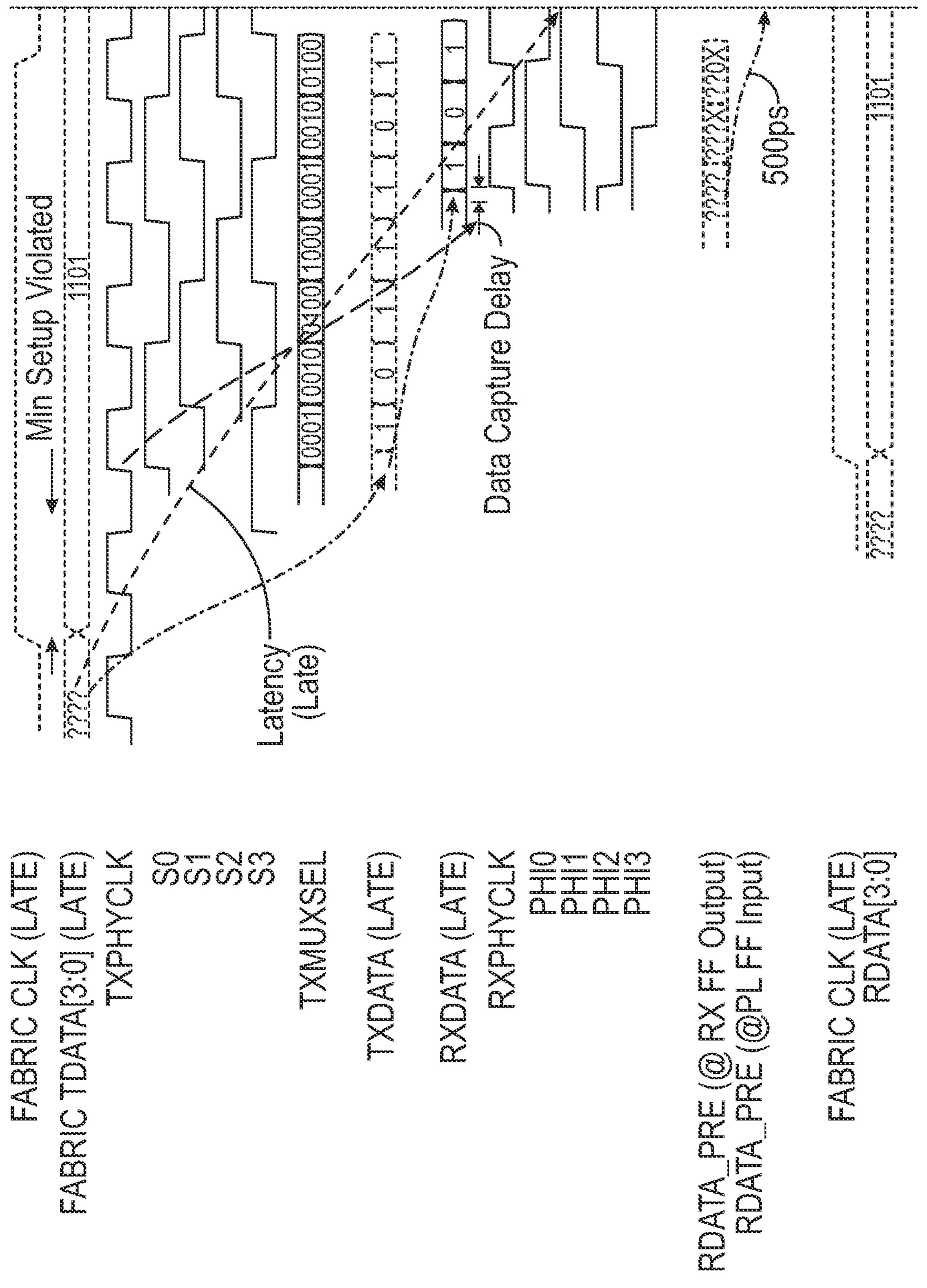
FIGS. 9A-9B illustrate the timing of the SERDES in FIGS. 8A-8B, according to one embodiment.
Figure 9B:
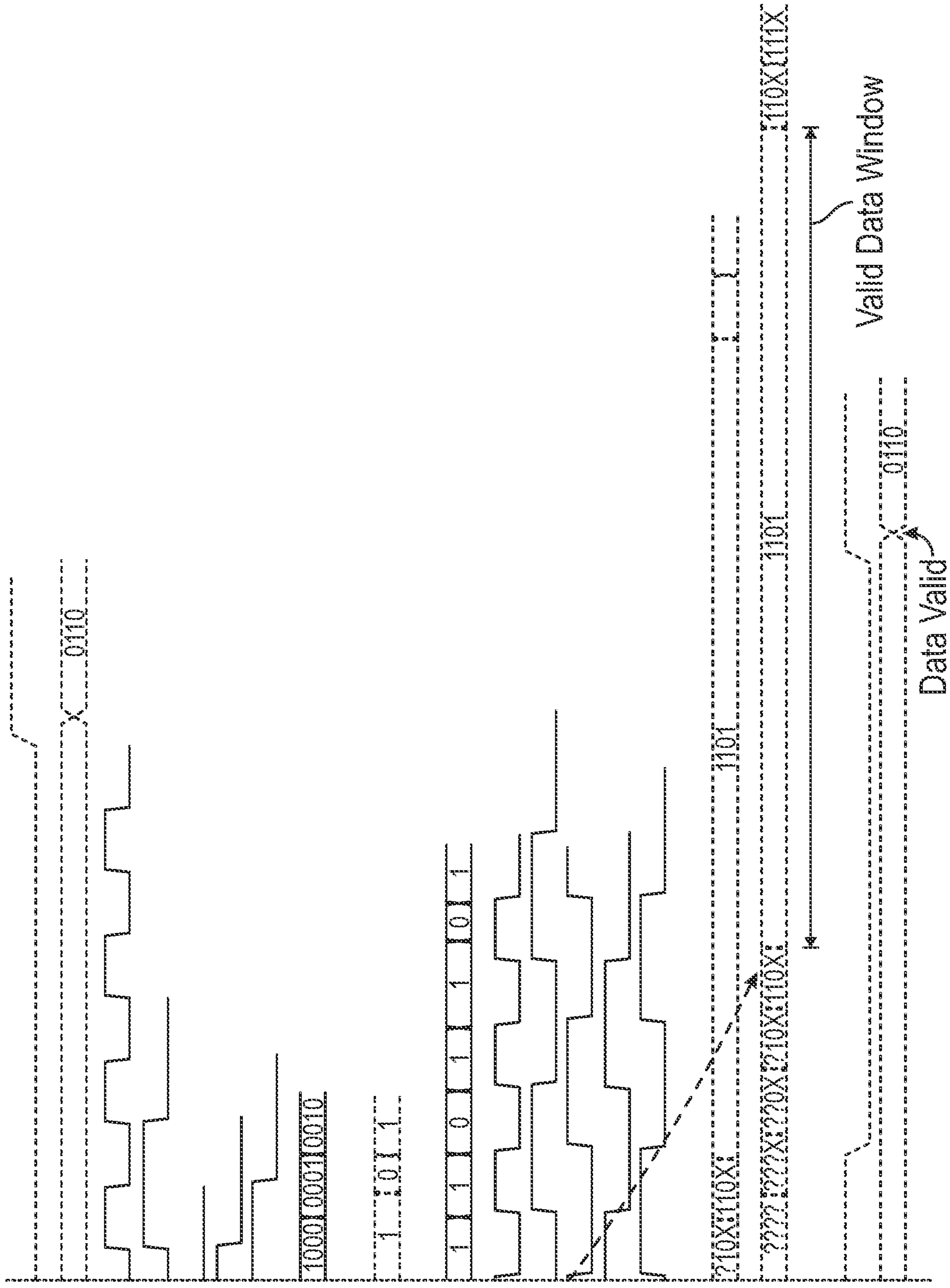

FIGS. 8A-8B illustrate oversampling SERDES, according to one embodiment. Oversampling is a technique that can be used to allow the C2C data transmission to be completely asynchronous to the PL clock. This relies on the C2C transmit clock running at a sufficiently high multiple of the PL clock that at least two samples of the PL data can be sent in one PL clock cycle. This way, if the first sample of a data bit is incorrect due to a timing failure, a second sample of that bit, which will be correct, will eventually arrive. An example of this type of SERDES is shown in FIGS. 8A-8B with the timing illustrated in FIGS. 9A-9B.

Figure 10A:
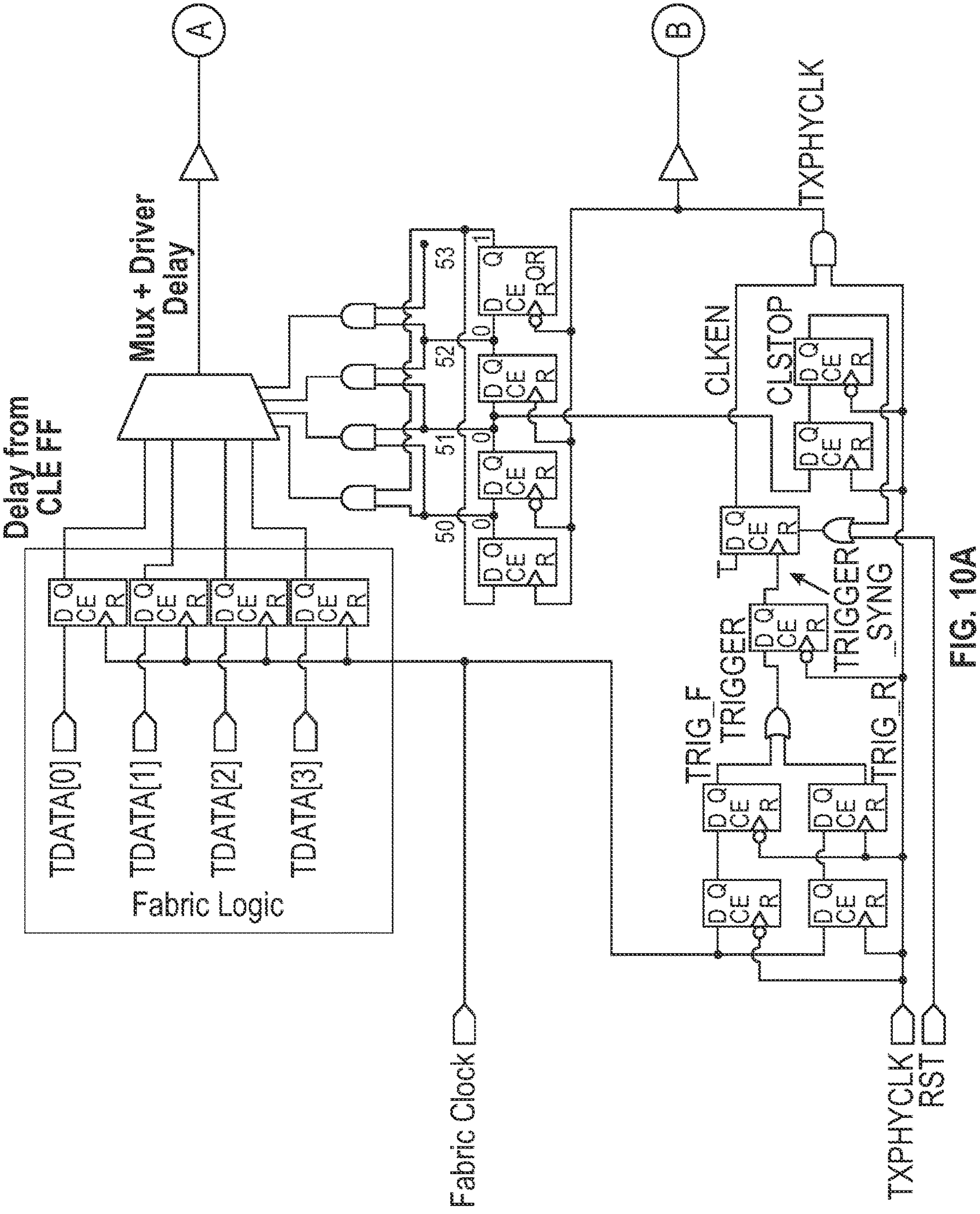
FIGS. 10A-10B illustrate synchronous burst SERDES, according to one embodiment.
Figure 10B:
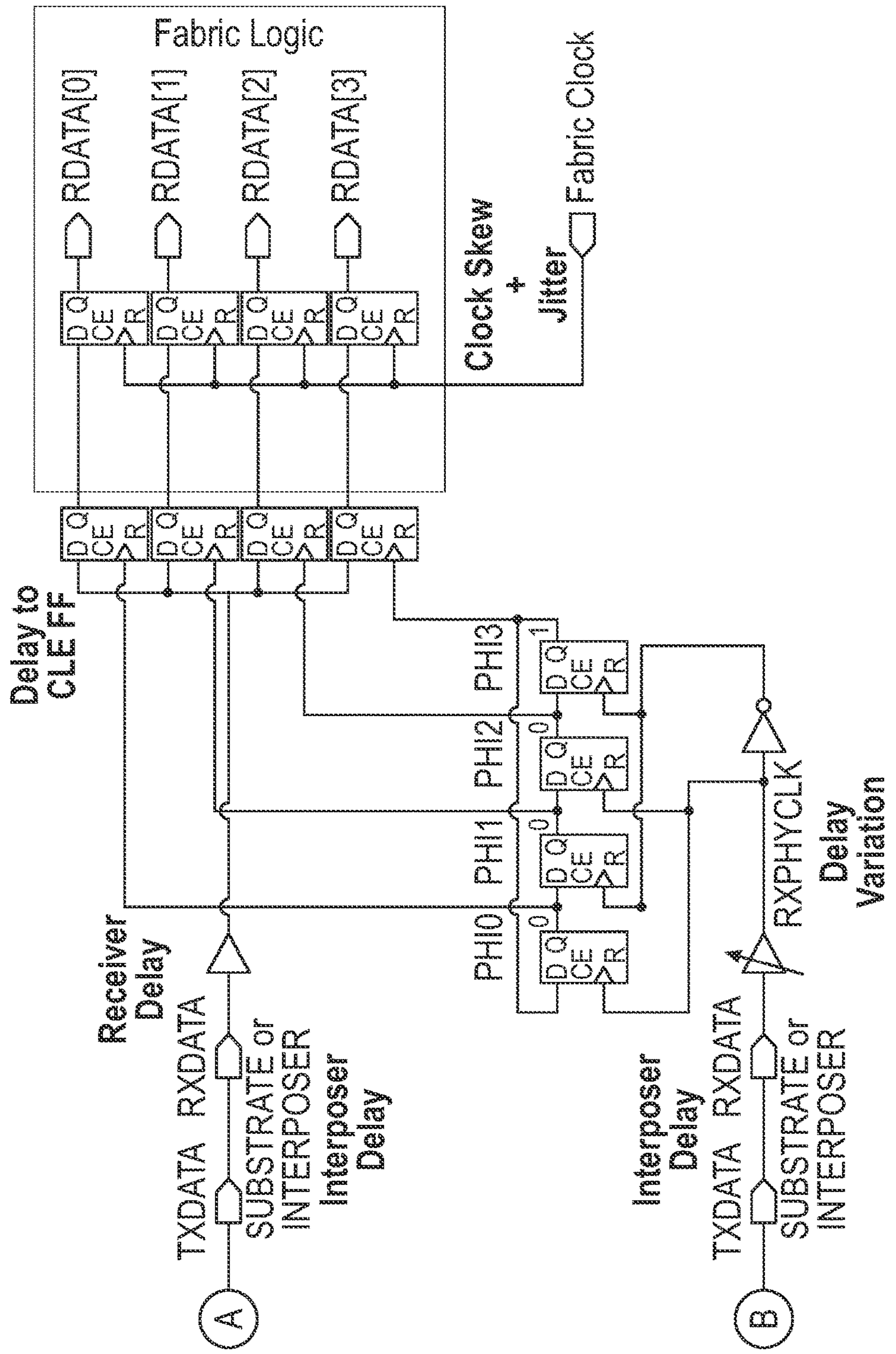
Figure 11A:
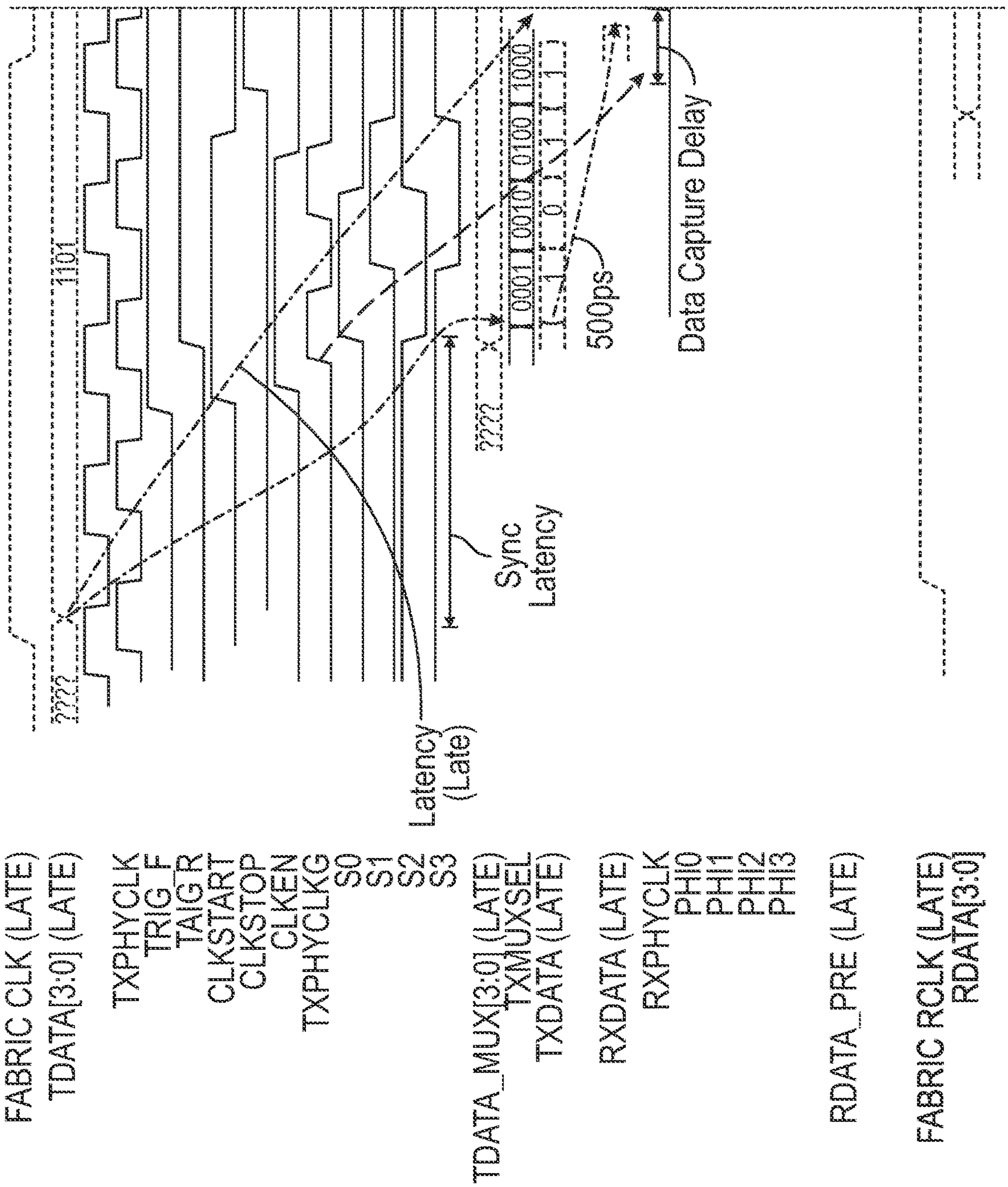
FIGS. 11A-11B illustrate the timing of the SERDES in FIGS. 10A-10B, according to one embodiment.
Figure 11B:
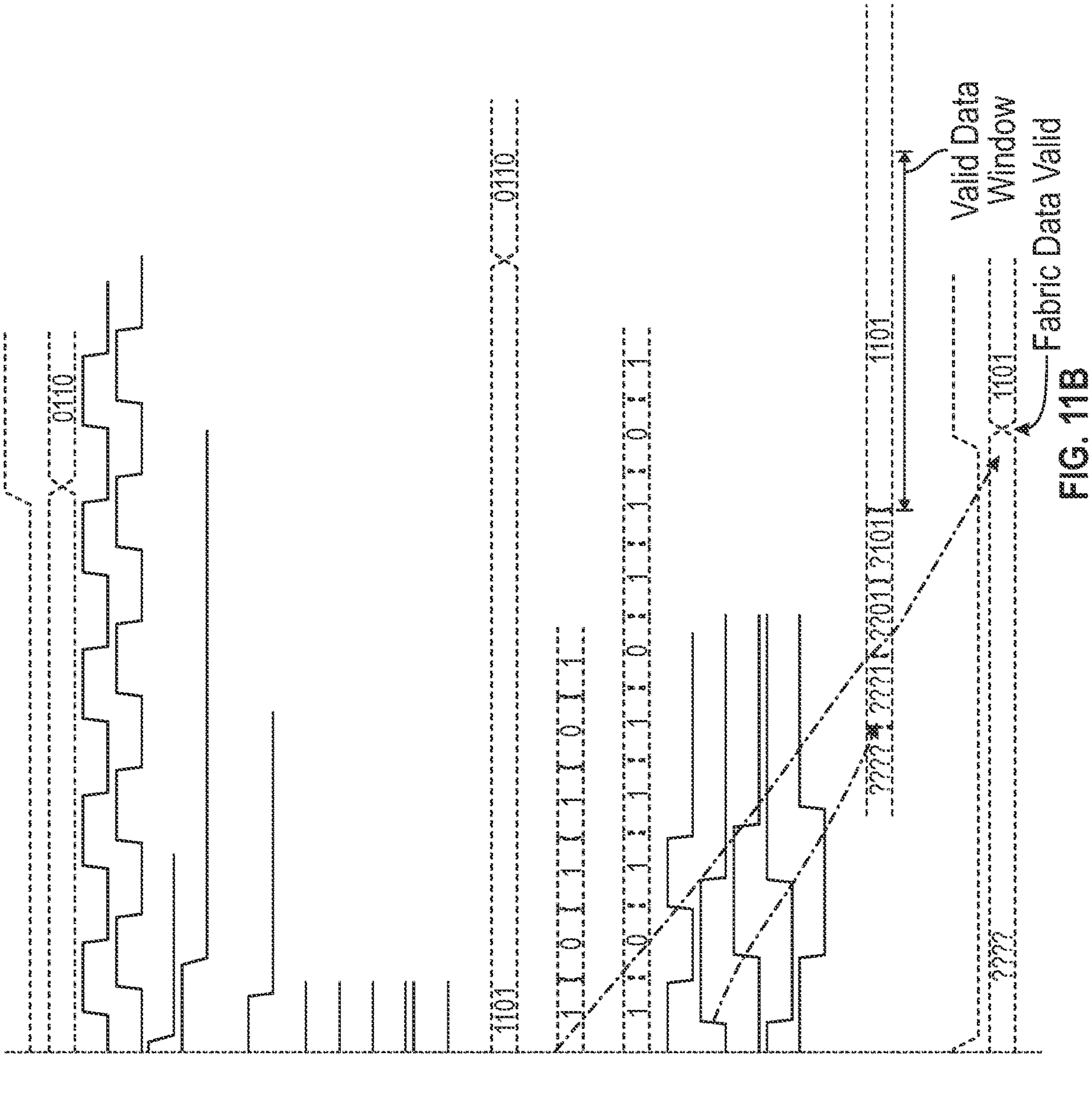

FIGS. 10A-10B illustrate synchronous burst SERDES, according to one embodiment. A synchronous burst SERDES uses a signal from the PL as a trigger which is then synchronized to the SERDES transmit clock and used to transmit a single burst of data. The synchronization process takes some number of transmit clock cycles—which is dependent on the clock frequency. The synchronization logic also increases the logic area of the solution—which may be a negative if implementation area must be minimized. FIGS. 10A-10B shows an example implementation of a synchronous burst SERDES with timing shown in FIGS. 11A-11B.

In one embodiment, the SERDES accepts the data from an asynchronous clock domain and then bursts the data across the interface at a rate that is equal to or greater than the incoming clock frequency. The Rx holds the data on its outputs until the end of the user clock period. Method steps can include the TX SERDES synchronizes the incoming data into the C2C clock domain, serializes the data, and adds dummy data to account for frequency mismatch between the user clock and the C2C clock. The RX SERDES detects the start of a burst, deserializes the data into a pre-defined data width, and ignores any dummy bits. The RX SERDES also holds the data at its outputs until the next burst is received.

Techniques for synchronizing the incoming data can include the use of a synchronizer block between the user clock domain and the C2C clock domain or using a Multiplying DLL or equivalent circuit that creates a pulse train at the transfer frequency that is aligned with the rising edge of the user clock.

Techniques for framing the data burst (where the C2C clock frequency is greater than the user clock by enough to add at least two extra bits into the data stream) include inserting Zero's after a burst with a one before the next burst, such as: 01, 001, 0001, . . . based on the number of dummy bits required, or inserting One's after a burst with a zero before the next burst, Such as: 10, 110, 1110, . . . based on the number of dummy bits required.

In one embodiment, a dedicated framing output is used where an independent valid data pin is used to send the framing data to the RX SERDES. The valid data pin can be matched to the transmitted data and would indicate the beginning of the burst. This could be done by recognizing a 0-to-1 transition as the start of a new burst. A 1-to-0 transition could also be used. The data pin could be considered a clock pin when a clock pattern is given as the data input (1100, 111000, 11110000, . . . ). The framing data can precede the burst to account for delay in detecting the framing in the Rx method to hold the valid data at the Rx outputs. In one embodiment, the Rx automatically stops de-serialization once it has decoded the predetermined word width and then waits for the next burst. During this wait time the valid data is available at its outputs. De-serialization starts or resumes when it detects the next framing bits.

Figure 12A:
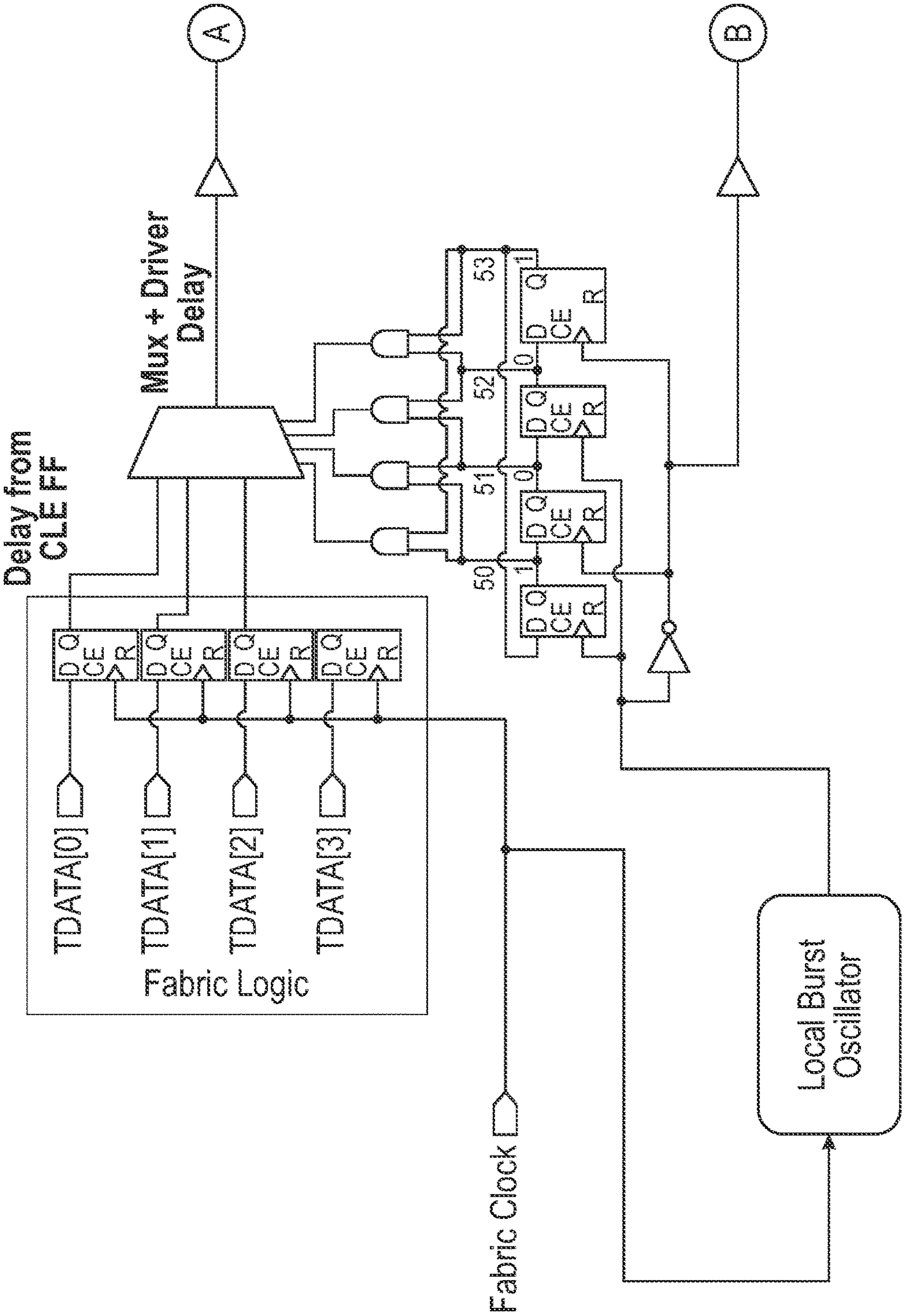
FIGS. 12A-12B illustrate a SERDES with a fixed length pulse train, according to one embodiment.
Figure 12B:
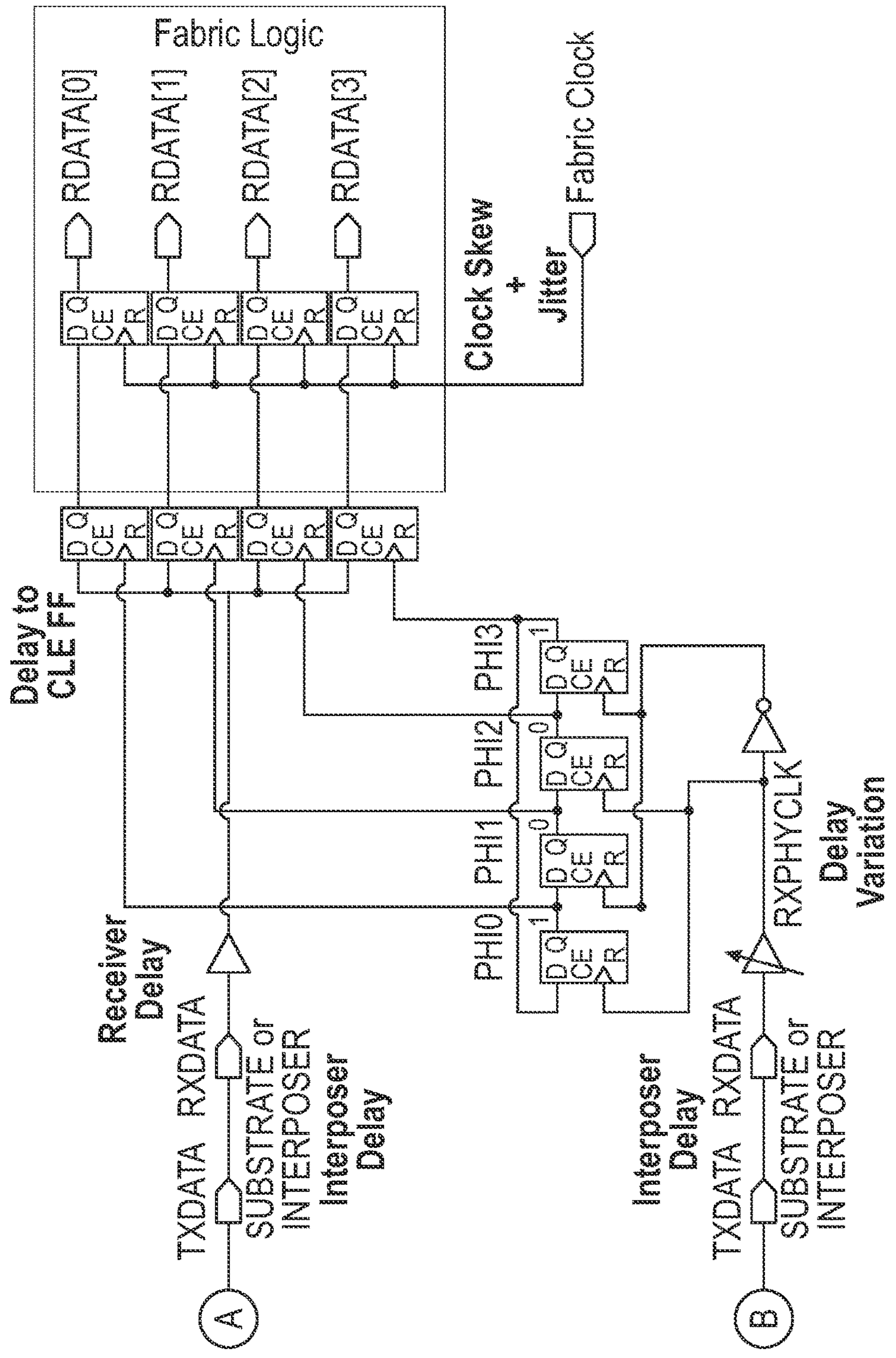
Figure 13:
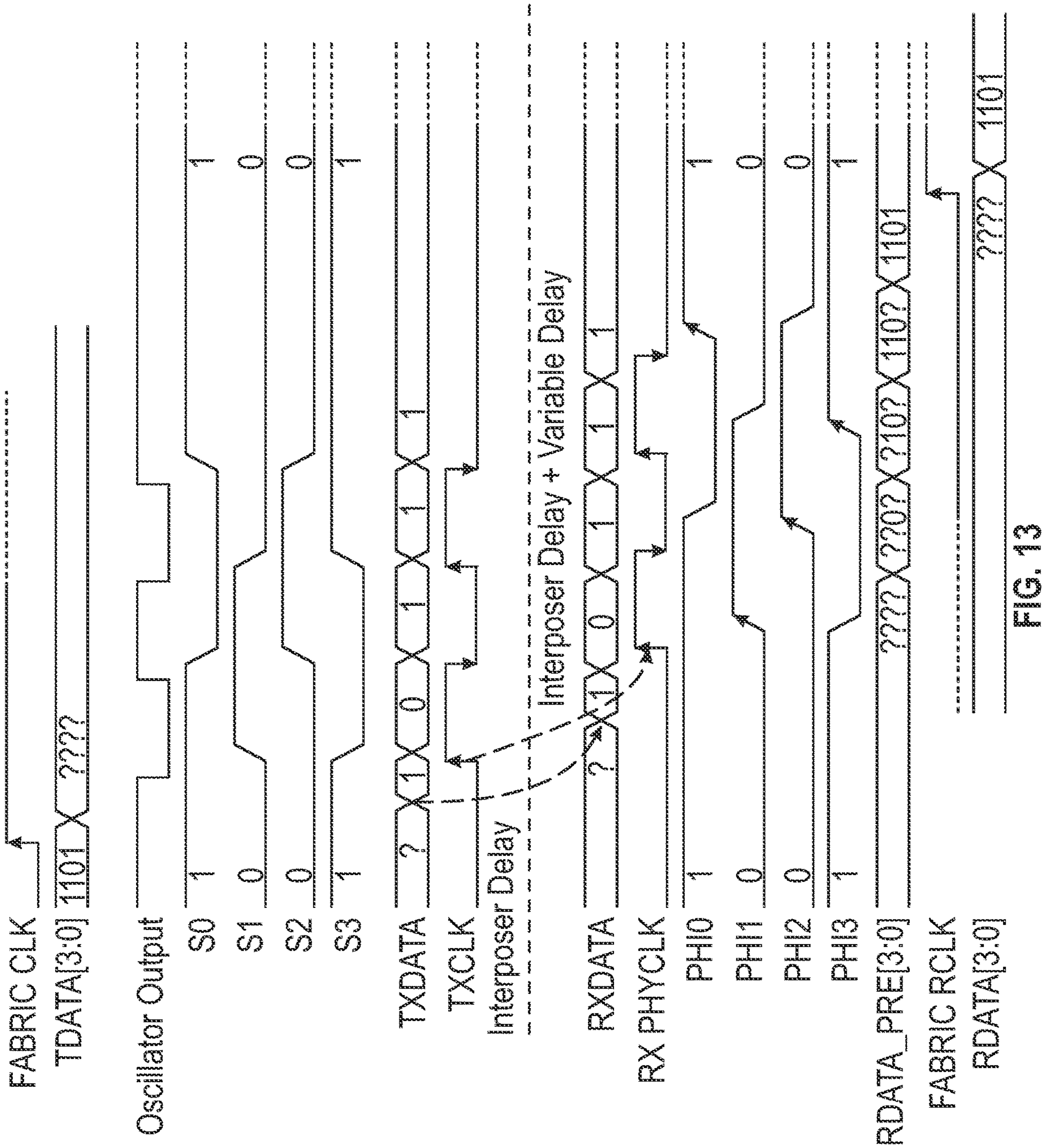
FIG. 13 illustrates the timing of the SERDES in FIGS. 12A-12B, according to one embodiment.

FIGS. 12A-12B illustrate a SERDES with a fixed length pulse train, according to one embodiment. That is, instead of a continuously running pulse train, the SERDES in FIGS. 12A and 12B has a fixed length pulse train. FIG. 13 illustrates the timing of the SERDES in FIGS. 12A-12B, according to one embodiment.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A system, comprising:

an application specific integrated circuit (ASIC) comprising:

a first network on chip (NOC);

a fabric sliver comprising programmable logic circuitry, and a plurality of hardened IP blocks comprising circuitry configured to communicate with the fabric sliver;

a second integrated circuit separate from the ASIC, the second integrated circuit comprising a programmable logic fabric, wherein the second integrated circuit comprises a field programmable gate array (FPGA), wherein the programmable logic fabric is part of the FPGA and is not part of any NOCs; and inter-die fabric extension connections coupled at a first end directly to the fabric sliver and at a second end directly to the programmable logic fabric.

2. The system of claim 1, wherein the second integrated circuit further comprises:

a second fabric sliver containing the programmable logic fabric, and a second plurality of hardened IP blocks comprising circuitry configured to communicate with the second fabric sliver.

3. The system of claim 1, wherein the plurality of hardened IP blocks are configured to use the fabric sliver and the inter-die fabric extension connections to communicate with the programmable logic fabric in the second integrated circuit.

4. The system of claim 1, wherein the second integrated circuit further comprises a second NoC, the system further comprising:

NoC inter-die bridge connections coupled at the first end to the first NoC and at the second end to the second NoC, wherein the plurality of hardened IP blocks are configured to use the first NoC, the NoC inter-die bridge connections, and the second NoC to access compute resources in the second integrated circuit.

5. The system of claim 1, wherein the programmable logic circuitry in the fabric sliver comprises Design for Test (DFT) and debug logic for testing an operation of at least one of the plurality of hardened IP blocks.

6. The system of claim 1, wherein at least one of the plurality of hardened IP blocks is configured to use the fabric sliver to communicate with the first NoC in the ASIC.

7. The system of claim 1, wherein a first one of the plurality of hardened IP blocks is configured to use the fabric sliver to communicate with a second one of the plurality of hardened IP blocks.

8. The system of claim 1, further comprising:

a chiplet disposed at a side of the second integrated circuit, wherein the plurality of hardened IP blocks in the ASIC is configured to access compute resources on the chiplet using the fabric sliver, the inter-die fabric extension connections, and the programmable logic fabric.

9. The system of claim 1, wherein the fabric sliver comprises serializers/deserializers (SERDES) coupled to the inter-die fabric extension connections, wherein a chip-to-chip (C2C) interface clock for operating the SERDES is independent of a clock for operating the programmable logic circuitry in the fabric sliver.

10. The system of claim 9, wherein a wire delay corresponding to the C2C interface is less than a system clock period.

11. The system of claim 9, wherein the fabric sliver comprises a plurality of SERDES, each of which is an independent unit relative to the other SERDES for timing purposes.

12. A system, comprising:

an application specific integrated circuit (ASIC) comprising:

a hardened chip-to-chip (C2C) interface, a first network-on-chip (NoC), wherein the first NoC has different circuitry than the hardened C2C interface, and a plurality of hardened IP blocks comprising circuitry configured to communicate with the hardened C2C interface;

a field programmable gate array (FPGA) separate from the ASIC, the FPGA comprising a programmable logic fabric and a second NoC;

inter-die connections coupled at a first end to the hardened C2C interface and at a second end to the programmable logic fabric; and NoC inter-die bridge connections coupled at the first end to the first NoC and at the second end to the second NoC, wherein the plurality of hardened IP blocks are configured to use the first NoC, the NoC inter-die bridge connections, and the second NoC to access compute resources in the FPGA.

13. The system of claim 12, wherein the plurality of hardened IP blocks are configured to use the hardened C2C interface and the inter-die connections to communicate with the programmable logic fabric in the FPGA.

14. The system of claim 12, further comprising:

a chiplet disposed at a side of the FPGA, wherein the plurality of hardened IP blocks in the ASIC is configured to access compute resources on the chiplet using the hardened C2C interface, the inter-die connections, and the programmable logic fabric.

15. A system, comprising:

an application specific integrated circuit (ASIC) comprising:

a network on chip (NOC);

a fabric sliver comprising programmable logic circuitry, and a plurality of hardened IP blocks comprising circuitry configured to communicate with the fabric sliver;

a second integrated circuit separate from the ASIC, the second integrated circuit comprising a programmable logic fabric, wherein the second integrated circuit comprises a field programmable gate array (FPGA), wherein the programmable logic fabric is part of the FPGA and is not part of any NOCs; and inter-die fabric extension connections coupled directly to both the fabric sliver and the programmable logic fabric, wherein the inter-die fabric extension connections extend the programmable logic fabric so that the programmable logic circuitry in the ASIC is part of the programmable logic fabric in the second integrated circuit.

16. The system of claim 15, wherein the second integrated circuit further comprises:

a second fabric sliver containing the programmable logic fabric, and a second plurality of hardened IP blocks comprising circuitry configured to communicate with the second fabric sliver.

17. The system of claim 15, wherein the plurality of hardened IP blocks are configured to use the fabric sliver and the inter-die fabric extension connections to communicate with the programmable logic fabric in the second integrated circuit.

18. The system of claim 1, wherein the programmable logic circuitry comprises one or more of:

configuration logic blocks;

configurable logic elements; and look up tables.

19. The system of claim 12, wherein the hardened chip-to-chip (C2C) interface comprises a fabric sliver comprising programmable logic circuitry, wherein the programmable logic circuitry comprises one or more of:

configuration logic blocks;

configurable logic elements; and look up tables.

20. The system of claim 15, wherein the programmable logic circuitry comprises one or more of:

configuration logic blocks;

configurable logic elements; and look up tables.

* * * * *